(12) United States Patent
Nakano

(10) Patent No.: US 10,615,065 B2
(45) Date of Patent: Apr. 7, 2020

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventor: Seiji Nakano, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/006,007

(22) Filed: Jun. 12, 2018

(65) Prior Publication Data

US 2018/0366356 A1 Dec. 20, 2018

(30) Foreign Application Priority Data

Jun. 16, 2017 (JP) ................................. 2017-118807

(51) Int. Cl.
| | |
|---|---|
| *H01L 21/67* | (2006.01) |
| *H01L 21/677* | (2006.01) |
| *G03F 7/16* | (2006.01) |
| *H01L 21/66* | (2006.01) |

(52) U.S. Cl.
CPC .......... *H01L 21/67288* (2013.01); *G03F 7/16* (2013.01); *H01L 21/6715* (2013.01); *H01L 21/67173* (2013.01); *H01L 21/67178* (2013.01); *H01L 21/67201* (2013.01); *H01L 21/67225* (2013.01); *H01L 21/67742* (2013.01); *H01L 21/67745* (2013.01); *H01L 21/67769* (2013.01);

(Continued)

(58) Field of Classification Search
CPC ......... H01L 21/67173; H01L 21/67178; H01L 21/67201; H01L 21/67225; H01L 21/67742; H01L 21/67745; H01L 21/67769; H01L 21/67778; H01L 22/12; H01L 21/673–67396; H01L 21/67–68792
See application file for complete search history.

(56) References Cited

U.S. PATENT DOCUMENTS

2006/0182533 A1* 8/2006 Ogi .................. H01L 21/67196
414/217
2011/0292356 A1* 12/2011 Tsukinoki ......... H01L 21/67276
355/27

(Continued)

FOREIGN PATENT DOCUMENTS

JP 2003-151878 A 5/2003

*Primary Examiner* — Shahed Ahmed
(74) *Attorney, Agent, or Firm* — Pearne & Gordon LLP

(57) ABSTRACT

An apparatus includes first load ports 2A and 2B and second load ports 2C and 2D provided in a left-right direction; a processing unit D2; an inspection module 4 provided between the first load ports 2A and 2B and the second load ports 2C and 2D; a first substrate transfer mechanism 5A provided at one side of the inspection module 4 in the left-right direction, and configured to transfer a substrate W into the processing unit D2 and a transfer container C on the first load ports 2A and 2B; a second substrate transfer mechanism 5B provided at the other side thereof, and configured to transfer the substrate W into the inspection module 4 and a transfer container C on the second load ports 2C and 2D; and a transit unit 51 for transferring the substrate W between the first and the second substrate transfer mechanisms 5A and 5B.

13 Claims, 15 Drawing Sheets

(52) U.S. Cl.
CPC ........ *H01L 21/67778* (2013.01); *H01L 22/12* (2013.01)

(56) References Cited

U.S. PATENT DOCUMENTS

| | | | |
|---|---|---|---|
| 2012/0013859 A1* | 1/2012 | Matsuoka | G03F 7/16 355/27 |
| 2012/0058253 A1* | 3/2012 | Miyata | H01L 21/67126 427/58 |
| 2014/0178162 A1* | 6/2014 | Morikawa | H01L 21/67265 414/416.08 |

* cited by examiner

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2017-118807 filed on Jun. 16, 2017, the entire disclosures of which are incorporated herein by reference.

TECHNICAL FIELD

The embodiments described herein pertain generally to a technique regarding a substrate processing apparatus equipped with an inspection module configured to inspect a substrate.

BACKGROUND

In photolithography in a manufacturing process of a semiconductor device, a resist film is formed by coating a resist on a surface of a semiconductor wafer (hereinafter, simply referred to as "wafer") used as a substrate, and a resist pattern is formed by performing a developing processing after the resist film is exposed to light. A coating and developing apparatus configured to perform the formation of the resist film and the developing processing may be equipped with an inspection module for inspecting a surface state of the wafer before or after the individual processings in the coating and developing apparatus are performed.

If, however, this inspection module is provided, a space for accommodating modules configured to process the wafer may be reduced. That is, for the reason of space limit, it may be difficult to provide or additionally provide the inspection module within the coating and developing apparatus. Further, in order to perform the inspection with high accuracy, maintenance of the inspection module may be regularly performed, for example. Thus, the inspection module may need to be provided in such a way to allow this maintenance to be performed easily. Thus, there is a demand for a technique capable of providing the inspection module within the apparatus while meeting all of the aforementioned requirements.

Patent Document 1 describes a coating and developing apparatus equipped with a carrier block having a load port on which a carrier accommodating wafers therein is placed; a processing block having a multiple number of processing modules configured to process the wafers; and an interface module configured to connect the processing block and an exposure apparatus. An inspection module is horizontally arranged with respect to the carrier block. According to this apparatus configuration, however, a footprint of the apparatus is increased due to the presence of the inspection module. Moreover, since a transfer device for the wafer provided in the carrier block transfers the wafers to both the processing block and the inspection module, a load of the transfer device may be larger, which may result in deterioration of a throughput of the apparatus. Thus, it is also required to suppress the deterioration of the throughput of the apparatus and the increase of the footprint of the apparatus which might be caused by providing the inspection module.

Patent Document 1: Japanese Patent Laid-open Publication No. 2003-151878

SUMMARY

In view of the foregoing, exemplary embodiments provide a technique capable of achieving a high throughput in a substrate processing apparatus equipped with an inspection module configured to inspect a substrate.

A substrate processing apparatus includes a first load port and a second load port respectively provided at one side and the other side in a left-right direction, and respectively configured to place thereon a transfer container accommodating a substrate therein; a processing unit configured to perform a processing on the substrate; an inspection module provided between the first load port and the second load port in the left-right direction, and configured to inspect the substrate before or after the processing by the processing unit is performed; a first substrate transfer mechanism provided at one side of the inspection module in the left-right direction, and configured to transfer the substrate into the processing unit and the transfer container placed on the first load port; a second substrate transfer mechanism provided at the other side of the inspection module in the left-right direction, and configured to transfer the substrate into the inspection module and the transfer container placed on the second load port; and a transit unit configured to transit the substrate between the first substrate transfer mechanism and the second substrate transfer mechanism.

A substrate processing method includes placing a transfer container accommodating a substrate therein on each of a first load port and a second load port respectively provided at one side and the other side in a left-right direction; performing a processing on the substrate by a processing unit; inspecting, before or after the processing by the processing unit is performed, the substrate by an inspection module provided between the first load port and the second load port in the left-right direction; transferring the substrate into the processing unit and the transfer container placed on the first load port by a first substrate transfer mechanism provided at one side of the inspection module in the left-right direction; transferring the substrate into the inspection module and the transfer container placed on the second load port by a second substrate transfer mechanism provided at the other side of the inspection module in the left-right direction; and transferring the substrate between the first substrate transfer mechanism and the second substrate transfer mechanism via a transit unit.

A computer-readable recording medium having stored thereon computer-executable instructions that, in response to execution, cause a substrate processing apparatus to perform a substrate processing method according to the present exemplary embodiment.

According to the present exemplary embodiment, there is provided an inspection module between a first load port and a second load port provided in a left-right direction. Further, a first substrate transfer mechanism is provided at one side of the inspection module in the left-right direction, and is configured to transfer the substrate into the processing unit and the transfer container placed on the first load port. Furthermore, a second substrate transfer mechanism is provided at the other side of the inspection module in the left-right direction, and is configured to transfer the substrate into the inspection module and the transfer container placed on the second load port. The substrate is transferred between the substrate transfer mechanisms via the transit unit. According to this configuration, it is possible to suppress the load increase of a single substrate transfer device. Therefore, the throughput reduction of the apparatus can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
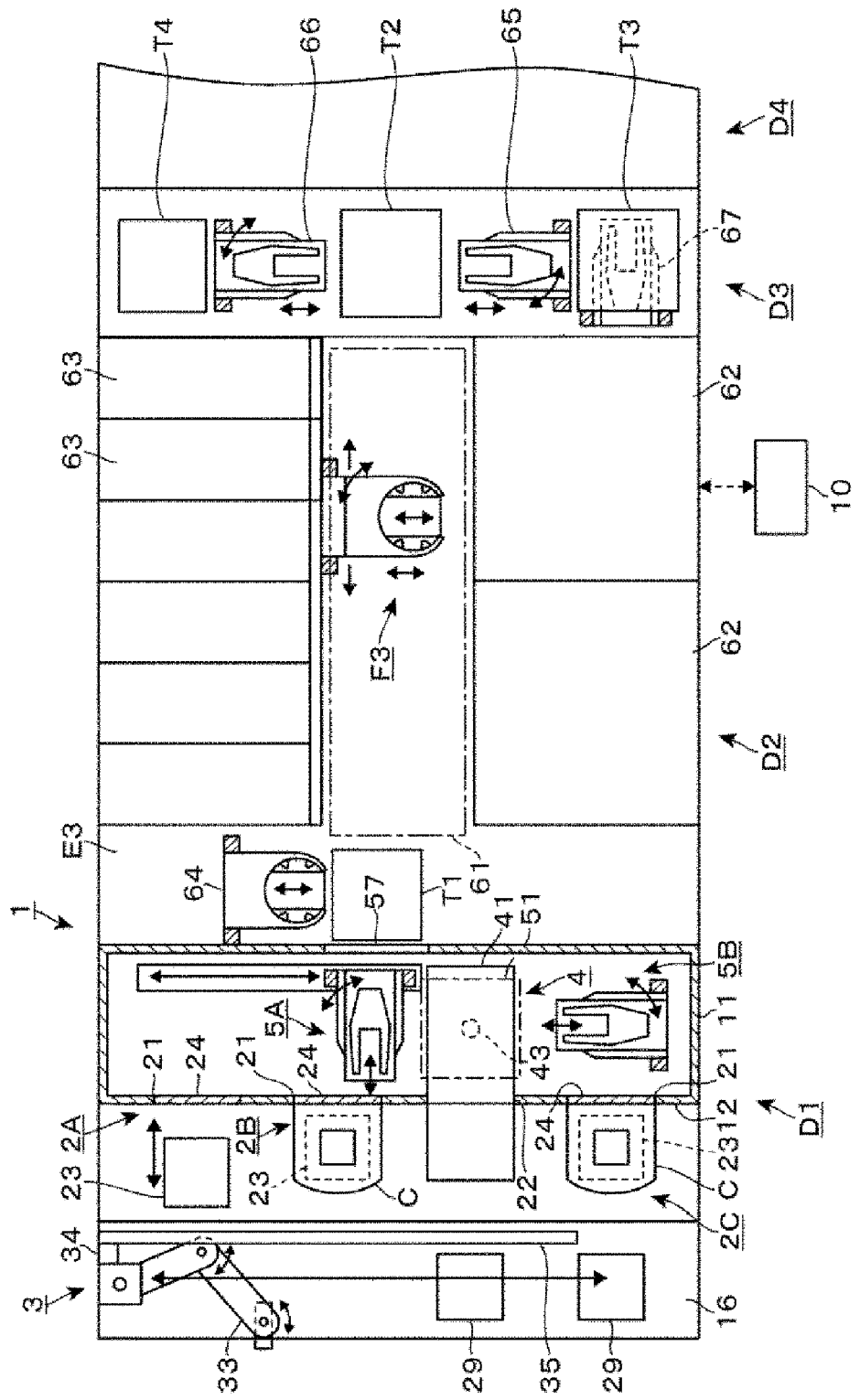
FIG. 1 is a transversal plan view of a coating and developing apparatus according to an exemplary embodiment of a substrate processing apparatus in the present disclosure.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Exemplary Embodiment

A coating and developing apparatus 1 according to a first exemplary embodiment of a substrate processing apparatus in the present disclosure will be explained with reference to a transversal plan view of FIG. 1 and a longitudinal side view of FIG. 2. The coating and developing apparatus 1 includes a carrier block D1, a processing block D2 and an interface block D3 which are connected horizontally in a straight-line shape in this sequence. An exposure apparatus D4 is connected with the interface block D3.

The blocks D1 to D3 will be briefly explained. A carrier C accommodating therein wafers W as circular substrates having a diameter of, e.g., 300 mm is transferred into the carrier block D1, and the carrier block D1 transfers the wafers W in the carrier C to the inside of the apparatus. For example, the carrier C is a transfer container of a wafer W called a FOUP (Front Opening Unified Pod), and is composed of a container main body and a lid provided at a front surface of the container main body. Further, the processing block D2 is configured to perform formation of an antireflection film, formation of a resist film and formation of a resist pattern through development of the resist film by supplying various kinds of chemical liquids onto the wafer W. The exposure apparatus D4 is configured to expose the wafer W to light such that the resist pattern is formed through the development, and the interface block D3 is configured to deliver the wafer W between the processing block D2 and the exposure apparatus D4.

The wafer W is processed by being transferred in the order of the carrier C→the carrier block D1→the processing block D2→the interface block D3→the exposure apparatus D4→the interface block D3→the processing block D2→the carrier block D1→the carrier C. During this transfer, before the wafer W is carried into the processing block D2 or after the wafer W is carried out of the processing block D2, the wafer W is transferred into an inspection module 4 provided in the carrier block D1, and then, a surface state of the wafer W is inspected therein. To elaborate, presence or absence of a foreign substance or presence or absence of abnormality of a pattern size is inspected. In the following, an inspection performed before the wafer W is carried into the processing block D2 will be referred to as "pre-processing inspection," and an inspection performed after the wafer W is carried out from the processing block D2 will be referred to as "post-processing inspection."

Figure 3:
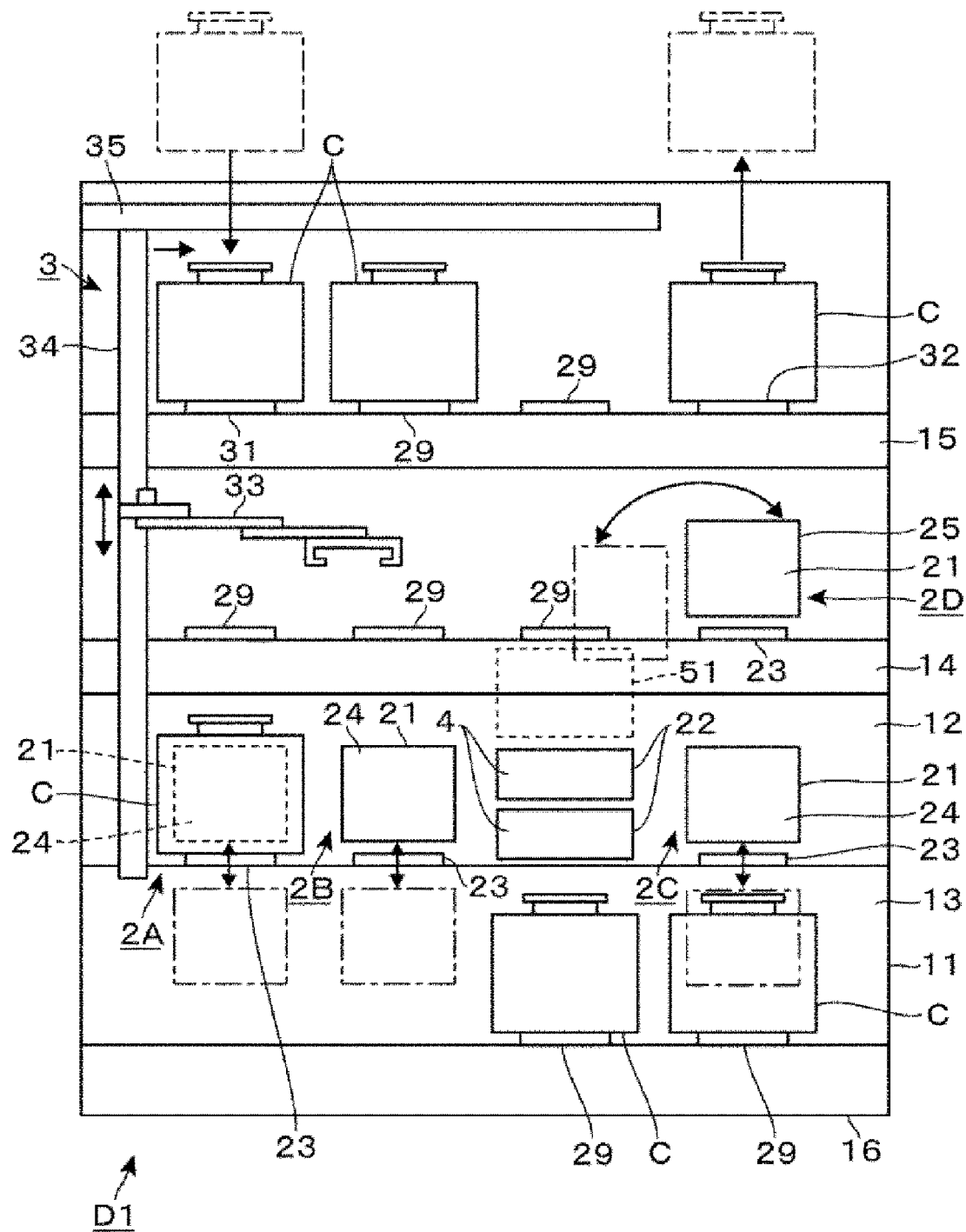
FIG. 3 is a front view of a carrier block belonging to the coating and developing apparatus.
Figure 4:
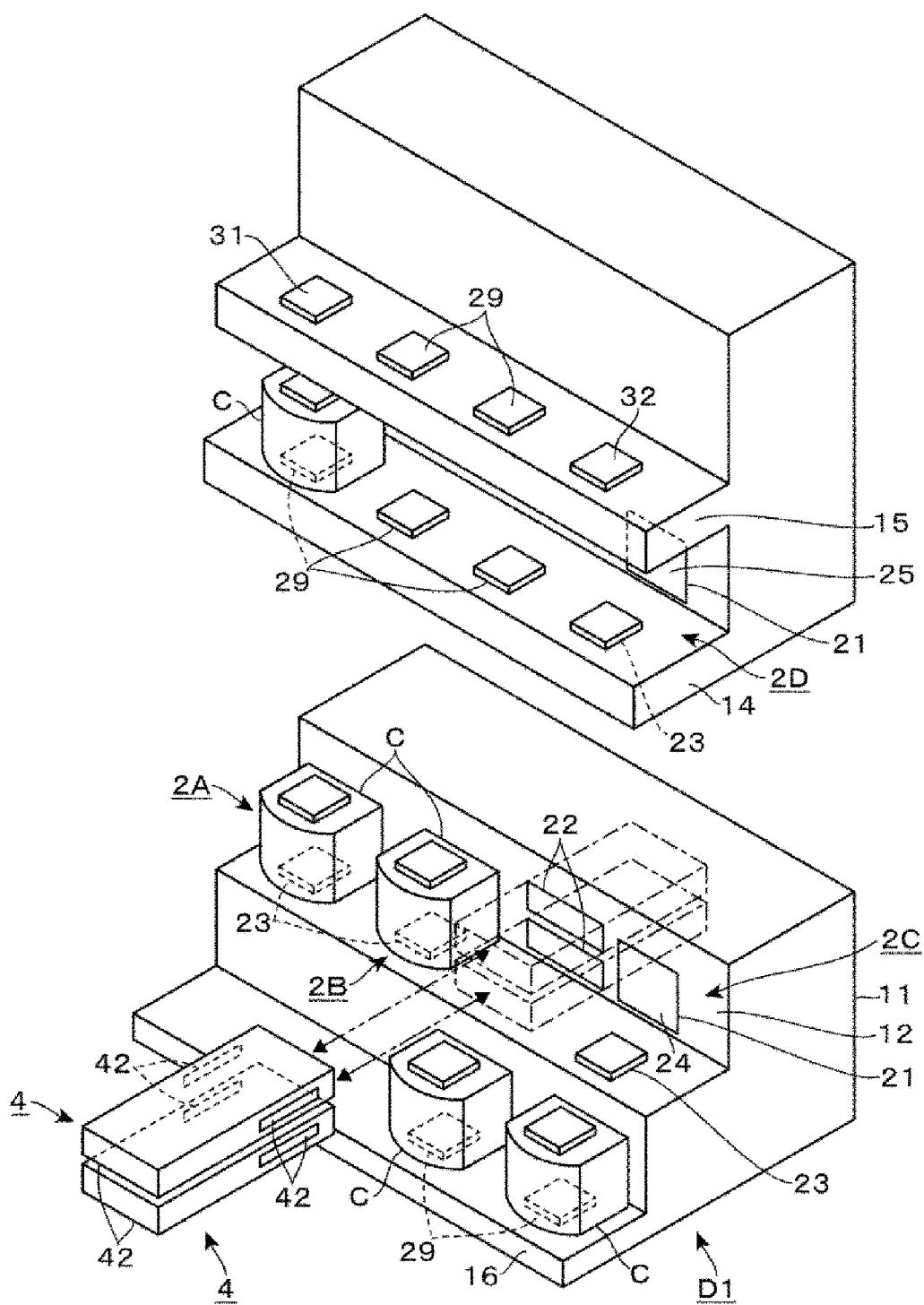
FIG. 4 is a perspective view of the carrier block.

Now, the carrier block D1 will be described with reference to a front view of FIG. 3 and a perspective view of FIG. 4. In FIG. 4, to illustrate individual components at the front side of the carrier block D1, the carrier block D1 is depicted to be divided in two vertically. Further, in the following description, the carrier block D1 side will be defined as a front side, and the interface block D3 side will be defined as a rear side. Further, unless otherwise noted, the left side and the right side in the following description refer to a left side and a right side when the rear side is seen from the front side.

The carrier block D1 has a rectangular housing 11, and individual sidewalls of the housing 11 are vertically formed. Three portions of a front wall 12, which is one of the sidewalls, are protruded forwards while being spaced apart from each other in the vertical direction, forming shelves in three levels. Among these three levels of shelves, the bottommost shelf is referred to as a supporting table 13; the middle shelf, a supporting table 14; and the topmost shelf, a supporting table 15. Further, a bottom end portion of the supporting table 13 is additionally protruded forwards, forming a supporting table 16. These supporting tables 13 to 16 are horizontally formed to support the carriers C thereon.

Between the supporting table 13 and the supporting table 14 on the front wall 12 of the housing 11, a transfer opening 21 for the wafer W, a transfer opening 21 for the wafer W, openings 22 each for providing an inspection module, and a transfer opening 21 for the wafer W are formed side by side in this order from the left side toward the right side while being spaced apart from each other. Each of the openings 22 has a flat rectangular shape, and these two openings are arranged vertically while being spaced apart from each other. On the supporting table 13, a moving stage 23 for placing the carrier C thereon is provided in front of each of the transfer openings 21. Each moving stage 23 is configured to be moved back and forth between a front position where a transfer of the carrier C is performed with respect to the corresponding moving stage 23 and a rear position where a transfer of the wafer W is performed between the carrier C and the inside of the housing 11 through the transfer opening 21.

Each transfer opening 21 is provided with an elevating door 24. A non-illustrated holding mechanism configured to hold the lid of the carrier C is provided at a front surface of the elevating door 24 and configured to deliver the lid with respect to the container main body forming the carrier C on the moving stage 23 located at the rear position. Further, the elevating door 24 is moved between a closing position where the transfer opening 21 is closed and an opening position which is retreated and moved down from the closing position and where the transfer opening 21 is opened. Accordingly, the elevating door 24 performs the opening/closing of the transfer opening 21 and the opening/closing of the lid of the carrier C. Further, the aforementioned opening position is indicated by dashed dotted lines in FIG. 2 and FIG. 3. Accordingly, if a mechanism, which is equipped with the stage on which the transfer container accommodating the wafers W therein is placed, the transfer opening through which the wafer W is carried into and out of the transfer container placed on the stage and the door configured to open/close the lid of the transfer container and open/close the transfer opening, is defined as a load port, three load ports are provided on the supporting table 13. In the drawings, to distinguish these three load ports, the load ports are assigned reference numerals 2A, 2B and 2C in order from the left side to the right side.

Figure 5:
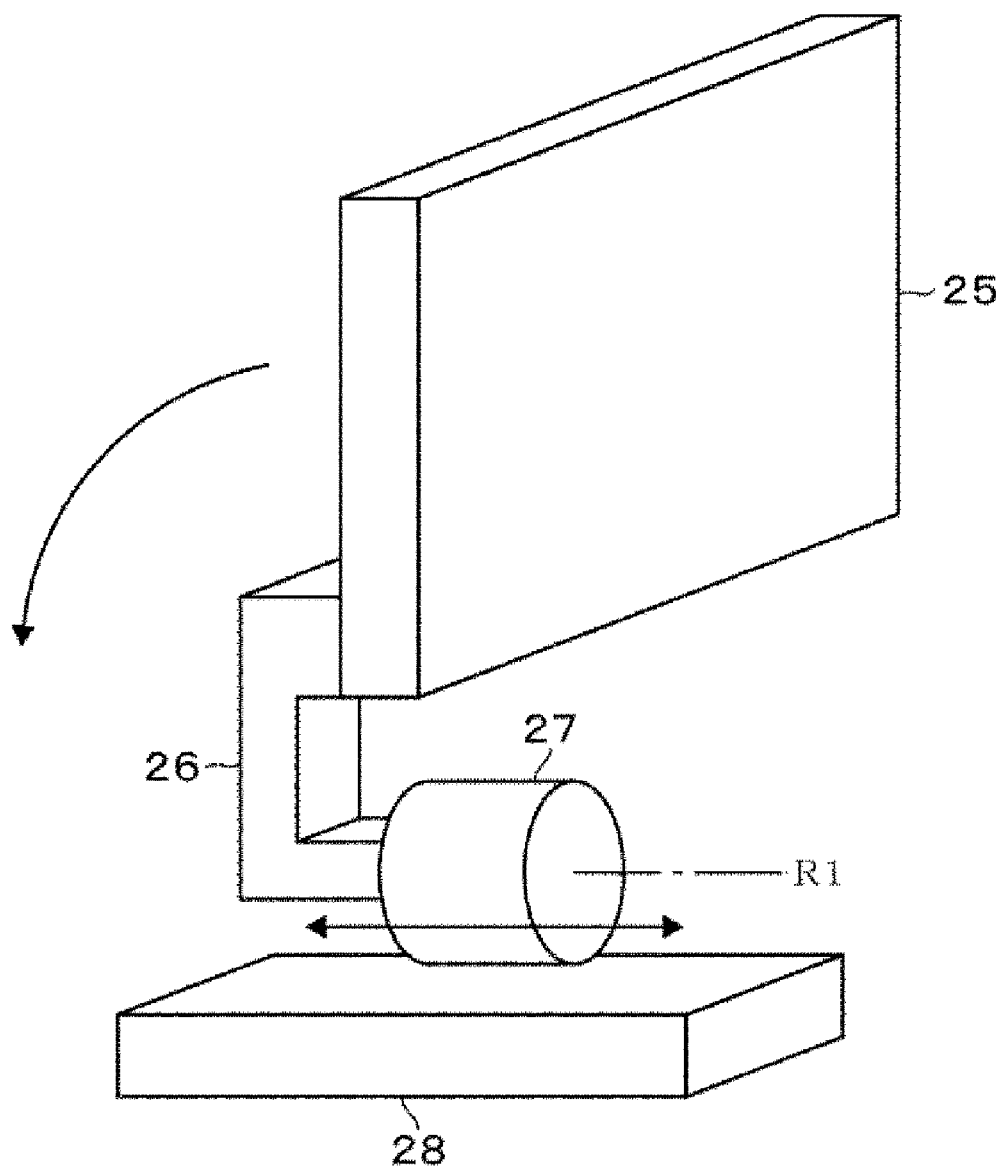
FIG. 5 is a schematic perspective view of a door of a load port provided in the carrier block.

Between the supporting table 14 and the supporting table 15 on the front wall 12, one transfer opening 21 for the wafer W is opened vertically above the transfer opening 21 of the aforementioned load port 2C. On the supporting table 14, the moving stage 23 as described above is provided in front of the transfer opening 21 provided between the supporting tables 14 and 15, and this transfer opening 21 is provided with a rotating door 25. FIG. 5 is a perspective view of the rotating door 25, and a reference numeral 26 in FIG. 5 denotes an arm having one end connected to a periphery portion of the rotating door 25. Further, in FIG. 5, a reference numeral 27 is a rotating mechanism to which the other end of the arm 26 is connected. When viewed from the forward-backward direction, the rotating mechanism 27 is configured to rotate the rotating door 25 around a horizontal rotation axis R1 which is located under the transfer opening 21 and coincides with the forward-backward direction. In FIG. 5, a reference numeral 28 is a forward-backward moving mechanism configured to move the rotating door 25 back and forth along with the rotating mechanism 27 and the arm 26.

The rotating door 25 is moved by the forward-backward moving mechanism 28 and the rotating mechanism 27 between a closing position where the transfer opening 21 is closed and an opening position which is retreated and rotated from the closing position by 90° and where the transfer opening 21 is opened. The opening position is indicated by dashed dotted lines in FIG. 2 and FIG. 3. As depicted in FIG. 3, when viewed from the forward-backward direction, the rotating door 25 located at the opening position is deviated from the transfer opening 21 in the transversal direction and is positioned above the openings 22. Further, the same as in the case of the elevating door 24, a non-illustrated holding mechanism configured to hold the lid of the carrier C is provided at a front face of the rotating door 25, and this lid is delivered to and from the container main body placed on the moving stage 23 at the rear position of the supporting table 14. That is, the rotating door 25 performs the opening/closing of the transfer opening 21 and the opening/closing of the lid of the carrier C. Accordingly, the rotating door 25, the transfer opening 21 opened/closed by the rotating door 25 and the moving stage 23 on the supporting table 14 are also configured to constitute a load port, which is assigned a reference numeral 2D in the drawings.

Further, on the supporting table 14, three standby stages 29 respectively configured to place the carrier C thereon are provided at the left side of the load port 2D while being arranged in a row with a distance therebetween in the left-right direction. When viewed from the forward-backward direction, the three standby stages 29 on the supporting table 14 are provided vertically above the openings 22, vertically above the moving stage 23 of the load port 2A and vertically above the moving stage 23 of the load port 2B, respectively. Now, the supporting tables 15 and 16 will be described. On the supporting table 15, a carry-in stage 31, a standby stage 29, a standby stage 29 and a carry-out stage 32 respectively configured to place the carrier C thereon are arranged in a row in this sequence from the left to the right while being spaced apart from each other. When viewed from the forward-backward direction, the carry-in stage 31 and the individual standby stages 29 on the supporting table 15 are located vertically above the respective standby stages 29 of the supporting table 14, and the carry-out stage 32 is located vertically above the moving stage 23 on the supporting table 14. Provided at the right side of the supporting table 16 with respect to a center thereof in the left-right direction are two standby stages 29. These two standby stages 29 are arranged in a row in the left-right direction. Here, however, the standby stages 29 may be provided at the left side of the supporting table 16 with respect to the center thereof.

The carrier C is transferred between the carry-in stage 31, the carry-out stage 32 and the standby stages 29 by a carrier transfer mechanism 3 to be described later. The carry-in stage 31 is a stage on which a non-illustrated external transfer mechanism places the carrier C to load the corresponding carrier C into the carrier block D1. The external transfer mechanism receives the carrier C placed on the carry-out stage 32 and carries the corresponding carrier C out of the carrier block D1. Further, each standby stage 29 is a stage on which the carrier C accommodating therein the wafers W before being carried into the apparatus and an empty carrier C from which the wafers W are carried into the apparatus stand by. Accordingly, the carrier C is transferred in the order of the carry-in stage 31→the standby stage 29→the moving stage 23 of one of the load ports 2A to 2D. Then, the wafers W of the carrier C are taken out on the corresponding moving stage 23. Subsequently, the carrier C is transferred in the order of the standby stage 29→the moving stage 23 of one of the load ports 2A to 2D. Then, the carrier C receives the wafers W on the moving stage 23. Thereafter, the carrier C is transferred in the order of the standby stage 29→the carry-out stage 32.

The standby stage 29 will be further explained. Since the load port 2D is provided at the right end portion of the supporting table 14 as stated above, there is a limit in the number of the standby stages 29 which can be provided on the supporting table 14. Besides on the supporting tables 14 and 15, however, the standby stages 29 are also provided on the supporting table 16 under the load ports 2A to 2D. Thus, a sufficient number of carriers C can be carried into the carrier block D1, and, therefore, a high throughput can be achieved.

Now, the carrier transfer mechanism 3 will be described. The carrier transfer mechanism 3 is provided in front of the front wall 12 of the carrier block D1. The carrier transfer mechanism 3 is equipped with a multi-joint arm 33 configured to hold a handle portion provided at a top portion of the carrier C; an elevating mechanism 34 configured to move the multi-joint arm 33 up and down; and a left-right moving mechanism 35 configured to move the elevating mechanism 34 in the left-right direction. The carrier transfer mechanism 3 having this configuration transfers the carrier C through the aforementioned path.

The carrier block D1 is equipped with two inspection modules 4 each configured to inspect the wafer W. These inspection modules 4 will be explained with reference to a longitudinal side view shown in FIG. 6. Each inspection module 4 includes a housing 41 having, for example, a flat rectangular shape elongated in the forward-backward direction, and the housing 41 is provided in the carrier block D1 by being fitted into the housing 11 through the opening 22 from the outside of the housing 11. Since the openings 22 are vertically arranged, the inspection modules 4 are also vertically arranged. Transfer openings 42 for the wafer W are respectively formed at left and right sidewalls of the housing 41 at the rear side thereof and are opened to the housing 11. The front side of the housing 41 is protruded from the front wall 12 of the housing 11.

Figure 6:
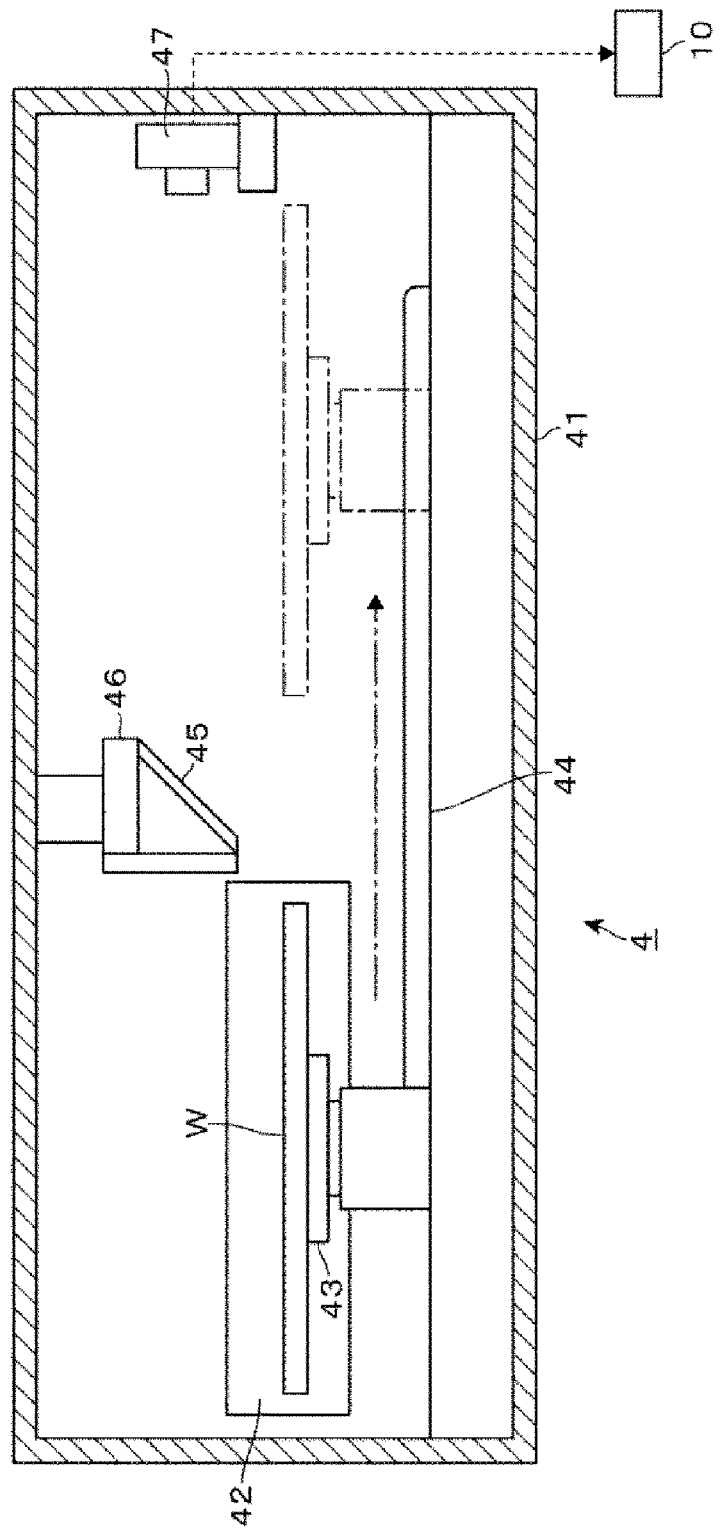
FIG. 6 is a longitudinal side view of an inspection module provided in the carrier block.

Provided within the housing 41 is a placing unit 43 configured to hold the wafer W horizontally by attracting a central portion of a rear surface of the wafer W. Within the housing 41, the placing unit 43 is movable between a standby position at the rear side and an imaging completion position at the front side. In FIG. 6, the standby position is indicated by a solid line, and the imaging completion position is marked by a dashed dotted line. Further, FIG. 1 illustrates the placing unit 43 located at the standby position. The standby position is a position facing the aforementioned transfer openings 42. As a fork 56 of a transfer mechanism 5A (5B) to be described later enters the housing 41 through the transfer opening 42 and then is moved up and down, the wafer W is transferred between the corresponding transfer mechanism 5A (5B) and the placing unit 43. Further, instead of the configuration in which the fork 56 is moved up and down, pins capable of being moved up and down may be provided within the housing 41, and the wafer W may be transferred between the corresponding transfer mechanism 5A (5B) and the placing unit 43 at the standby position by the pins. In the drawing, a reference numeral 44 denotes a moving mechanism configured to move the placing unit 43 back and forth.

Within the housing 41, a half mirror 45 horizontally elongated and extended in the left-right direction is provided above a moving path of the wafer W by the placing unit 43. This half mirror 45 is obliquely arranged when viewed from the side with respect to a moving direction of the wafer W. Further, a lighting device 46 configured to irradiate light downwards through the half mirror 45 is provided above the half mirror 45. A camera 47 is provided at an inner side of the half mirror 45. The light irradiated from the lighting device 46 travels through the half mirror 45 and reaches an irradiation region under the half mirror 45. Then, reflection light from an object in this irradiation region is reflected by the half mirror 45 and reaches the camera 47. That is, the camera 47 is capable of imaging the object located in an imaging region under the half mirror 45.

While the placing unit 43 having received at the standby position the wafer W from the transfer mechanism 5A (5B) is being moved toward the imaging completion position, the camera 47 images the wafer W intermittently, so that the entire surface of the wafer W is imaged, so that image data are obtained. The image data are sent from the camera 47 to a control unit 10 to be described later, and inspection of the surface of the wafer W is performed by the control unit 10 based on the image data. Further, the placing unit 43 once moved to the imaging completion position is returned back to the standby position in order to transfer the wafer W back to the transfer mechanism 5A (5B).

Figure 7:
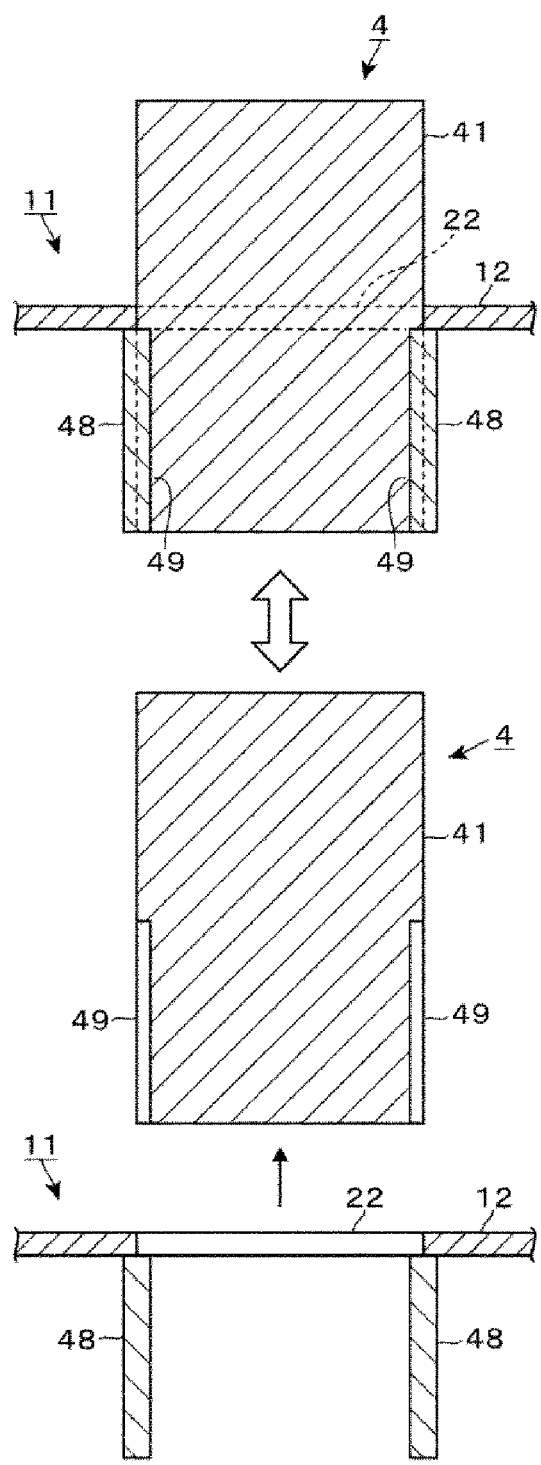
FIG. 7 is a schematic plan view of the inspection module.

The inspection module 4 is configured to be provided detachably from the carrier block D1. By way of example, as shown in FIG. 7, guide rails 48 extended along an opening direction of the opening 22 toward the inside of the housing 11 are provided as engaging portions at periphery portions of the opening 22 of the carrier block D1. Meanwhile, the housing 41 of the inspection module 4 is provided with grooves 49 which are extended from the rear end of the housing 41 toward the front side thereof to be engaged with the engaging portions. As stated above, when the inspection module 4 is mounted to the carrier block D1 as the rear portion of the housing 41 of the inspection module 4 is fitted into the housing 11 of the carrier block D1, the grooves 49 and the guide rails 48 are engaged with each other, as illustrated in the top part of FIG. 7.

By way of example, as an operator pulls forward the front portion of the inspection module 4 protruded from the opening 22, the rear portion of the housing 41 is taken out of the housing 11 along the guide rails 48, and the grooves 49 are disengaged from the guide rails 48 as shown in the lower part of FIG. 7, so that the inspection module 4 is separated from the carrier block D1. To mount the inspection module 4 to the housing 11, the reverse operations as performed to separate them are performed. In this way, by configuring the inspection module 4 to be attachable to/detachable from the carrier block D1, maintenance of the inspection module 4 such as replacement of the lighting device 46 can be easily carried out. Further, illustration of the guide rails 48 and the grooves 49 are omitted except for in FIG. 7.

Figure 8:
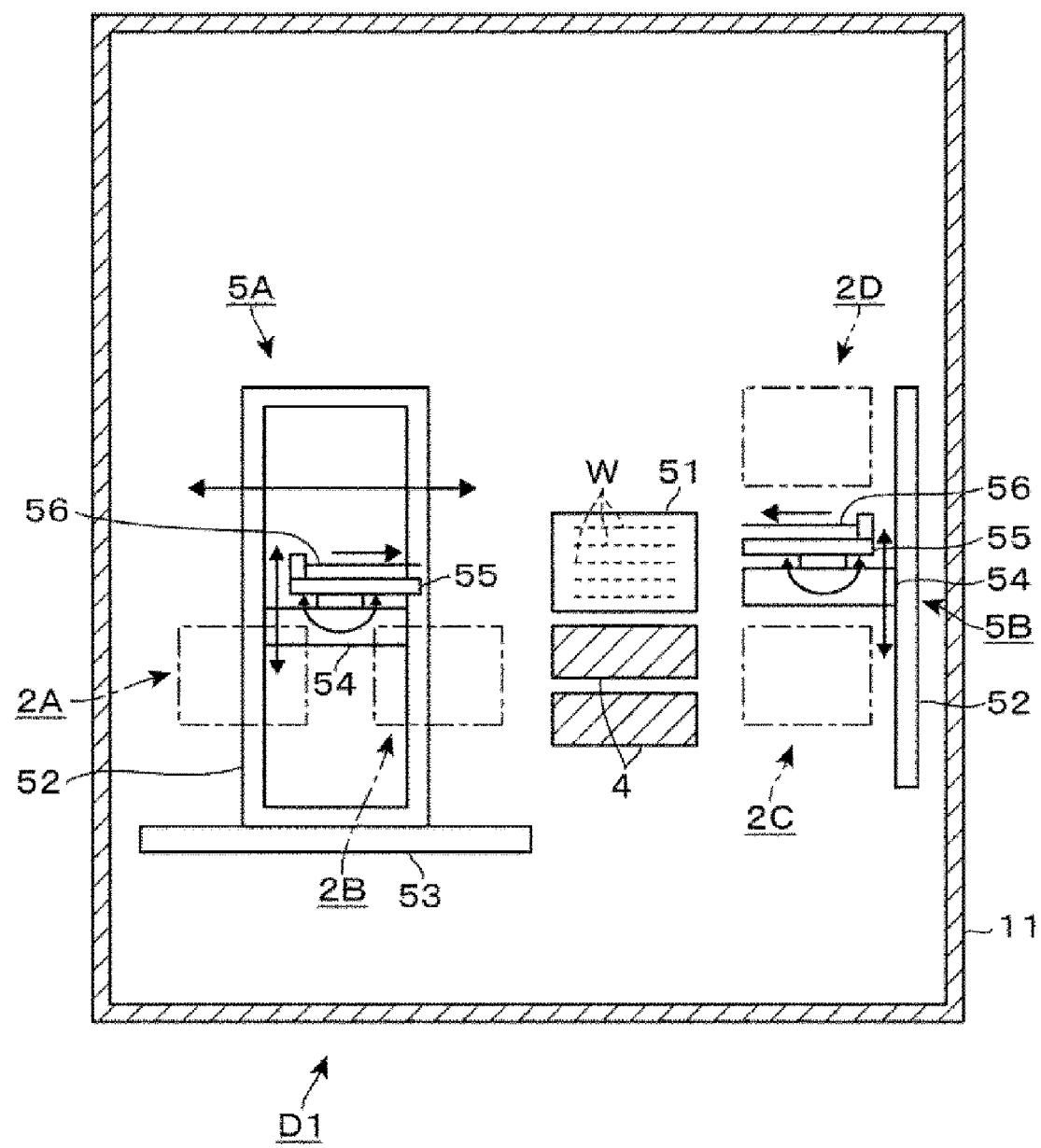
FIG. 8 is a longitudinal front view of the carrier block.

Now, an internal configuration of the housing 11 will be explained with reference to a longitudinal front view of the carrier block D1 shown in FIG. 8. Within the housing 11, a buffer module 51 is provided. This buffer module 51 is configured to accommodate therein a plurality of wafers W which are arranged in the vertical direction with a gap therebetween. By way of example, the buffer module 51 has a configuration in which multiple sets of three pins configured to support the rear surface of the wafer W are arranged in the vertical direction. However, the buffer module 51 is not limited to having such a configuration equipped with the pins but may be configured to support a peripheral portion of the wafer W in a bowl shape to drop the wafer W onto a preset position by guiding the peripheral portion of the wafer W. This buffer module 51 is positioned above the inspection module 4 to overlap with the standby position of the placing unit 43 of the inspection module 4 when viewed from the top. The buffer module 51 constitutes a standby unit in which the wafers W to be processed next are placed to stand by until the inspection module 4 is emptied (that is, a previously inspected wafer W is carried out from the inspection module 4) and a next wafer W can be carried into the inspection module 4.

The transfer mechanism 5A is provided at the left side of the buffer module 51 and the inspection module 4, and the transfer mechanism 5B is provided at the right side thereof. The transfer mechanism 5A is equipped with a frame 52 standing upright, a left-right moving mechanism 53 configured to move the frame 52 in the left-right direction, an elevation table 54 provided at the frame 52 to be movable vertically, a base 55 configured to be pivotable around the vertical axis on the elevation table 54 and the fork 56 configured to be movable back and forth on the base 55 and support the rear surface of the wafer W. Further, a region in which the aforementioned frame 52 is moved by the left-right moving mechanism 53 is limited to the region at the left side of the buffer module 51 and the inspection modules 4.

Through cooperation of the aforementioned individual components constituting the transfer mechanism 5A, the transfer mechanism 5A as a first substrate transfer mechanism is capable of transferring the wafer W between the carrier C provided on the load ports 2A and 2B as a first load port, the placing unit 43 at the standby position within the inspection module 4, the buffer module 51 and a transit module of a tower T1 to be described later. Further, a reference numeral 57 in FIG. 1 denotes a transfer path for the wafer W provided on the rear side of the housing 11 to transfer the wafer W to the tower T1. The transfer mechanism 5B as a second substrate transfer mechanism has the same configuration as the transfer mechanism 5A except that the transfer mechanism 5B is not equipped with the left-right moving mechanism 53. Through cooperation of individual components constituting the transfer mechanism 5B, the transfer mechanism 5B is capable of transferring the wafer W between the carrier C provided on the load ports 2C and 2D as a second load port, the placing unit 43 at the standby position within the inspection module 4 and the buffer module 51. In these configurations, both the transfer mechanism 5A and the transfer mechanism 5B are capable of transferring the wafers W to the buffer module 51 and the placing unit 43 of the inspection module 4. Thus, the buffer module 51 and the placing unit 43 are also used as transit units in which the wafer W is placed to be transferred between the transfer mechanisms 5A and 5B.

Now, the processing block D2 will be explained with reference to FIG. 1 and FIG. 2. The processing block D2 includes first to six unit blocks E1 to E6 which are stacked on top of each other in sequence from the bottom, and configured to perform liquid processings on the wafer W. The unit blocks E1 and E2 are same; the unit blocks E3 and E4 are same; and the unit blocks E5 and E6 are same. Of the two same unit blocks, the wafer W is transferred into either one of them. Here, the unit block E3 shown in FIG. 1 will be representatively explained. The unit block E3 includes a transfer region 61 for the wafer W which is extended in the forward-backward direction. At the right side of the transfer region 61, two resist film forming modules 62 each configured to form a resist film by coating a resist as a chemical liquid onto the surface of the wafer W are arranged in the forward-backward direction. At the left side of the transfer region 61, a multiple number of heating modules 63 each configured to heat the wafer W is arranged in the forward-backward direction along the transfer region 61. Further, a transfer mechanism F3 configured to transfer the wafer W within the unit block E3 is provided in the transfer region 61.

Differences of the unit blocks E1, E2, E5 and E6 from the unit blocks E3 and E4 will be explained. Each of the unit blocks E1 and E2 is equipped with, instead of the resist film forming module 62, an antireflection film forming module. To form the antireflection film on the wafer W, the antireflection film forming module is configured to form an antireflection film by coating, instead of the resist, a chemical liquid for forming an antireflection film. Each of the unit blocks E5 and E6 is equipped with, instead of the resist film forming module 62, a developing module. The developing module is configured to supply a developing liquid as a chemical liquid onto the wafer W. As described above, for the modules configured to supply the chemical liquids, the unit blocks E1 to E6 have the same configuration except that they supply the different kinds of chemical liquids. In FIG. 2, transfer mechanisms of the unit blocks E1, E2 and E4 to E6 corresponding to the transfer mechanism F3 are assigned reference numerals F1, F2 and F4 to F6, respectively.

Within the processing block D2, a tower T1 vertically extended along the unit blocks E1 to E6 and composed of a multiple number of transit modules stacked on top of each other; and a transfer mechanism 64 configured to transfer the wafer W between the individual modules of the tower T1 are provided at the side of the carrier block D1. Within the tower T1, the transit modules TRS1 to TRS6 in which the wafers W are placed are provided at the same heights as the unit blocks E1 to E6, respectively. Further, the tower T1 is also equipped with transit modules in which the wafers W are placed to be transferred to/from the transfer mechanism 5A as stated above, and these transit modules are assigned reference numerals TRS0 and TRS10.

The interface block D3 includes towers T2, T3 and T4 vertically extended along the unit blocks E1 to E6, and is equipped with a transfer mechanism 65 configured to transfer the wafer W with respect to the tower T2 and the tower T3; a transfer mechanism 66 configured to transfer the wafer W with respect to the tower T2 and the tower T4; and a transfer mechanism 67 configured to transfer the wafer W between the tower T3 and the exposure apparatus D4. The tower T2 includes transit modules TRS which are stacked on top of each other and configured to transfer the wafers W to the unit blocks. Further, though modules are provided in the towers T3 and T4 as well, elaboration thereof will be omitted herein.

Figure 2:
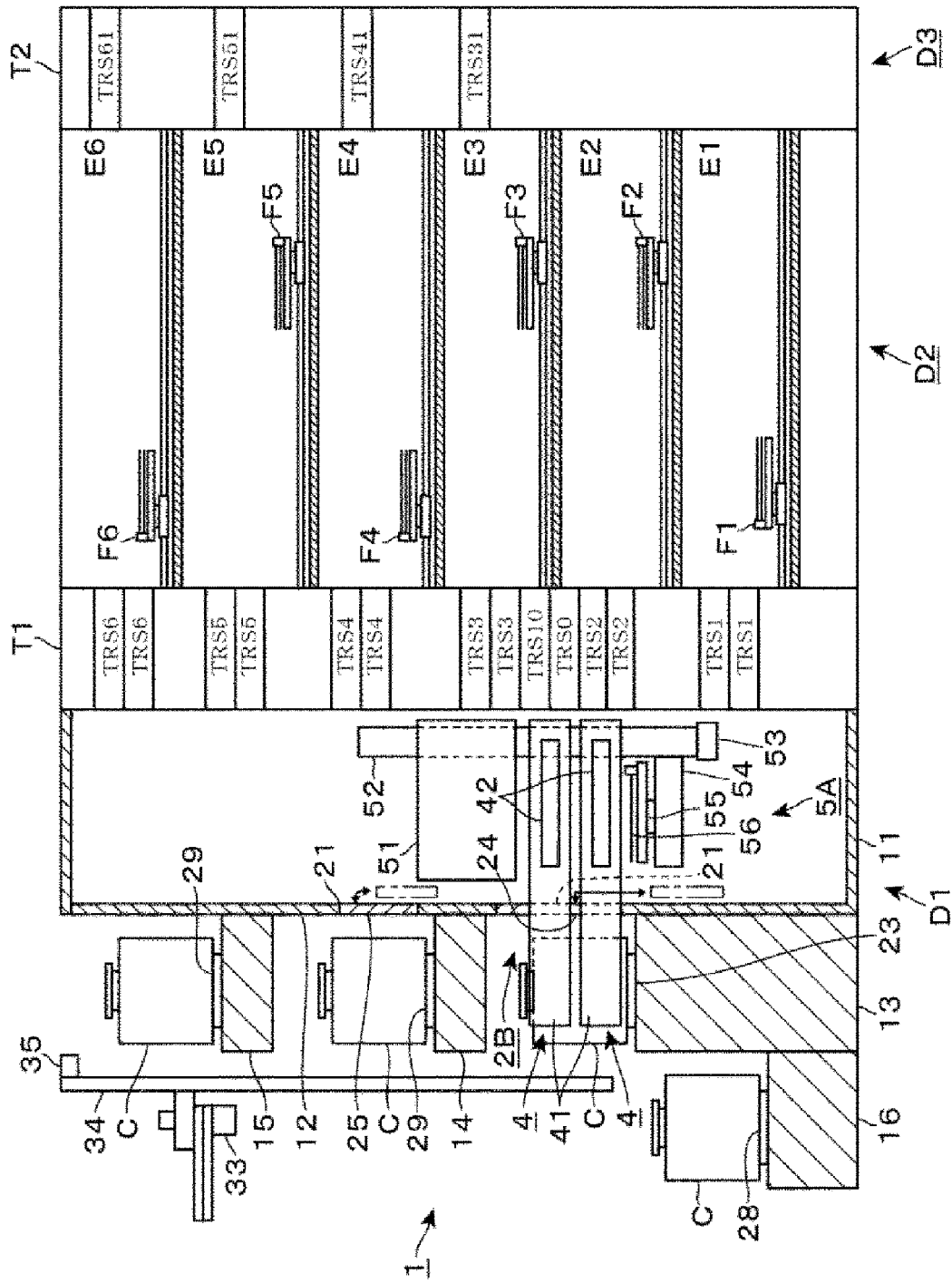
FIG. 2 is a longitudinal side view of the coating and developing apparatus.

As depicted in FIG. 1, the coating and developing apparatus 1 is equipped with the control unit 10 which is implemented by a computer. The control unit 10 has a non-illustrated program storage unit storing programs therein. The programs include commands prepared to allow the transfer of the wafers W by the respective transfer mechanisms, the transfer of the carriers C by the carrier transfer mechanism 3 and processings on the wafers W in the individual modules to be controlled in response to control signals sent from the control unit 10 to the individual components of the coating and developing apparatus 1, so that the formation and the inspection of the resist pattern on each wafer W are carried out. The programs are stored in the program storage unit by being stored in a recording medium such as, but not limited to, a hard disk, a compact disk, a DVD, or a memory card.

Figure 9:
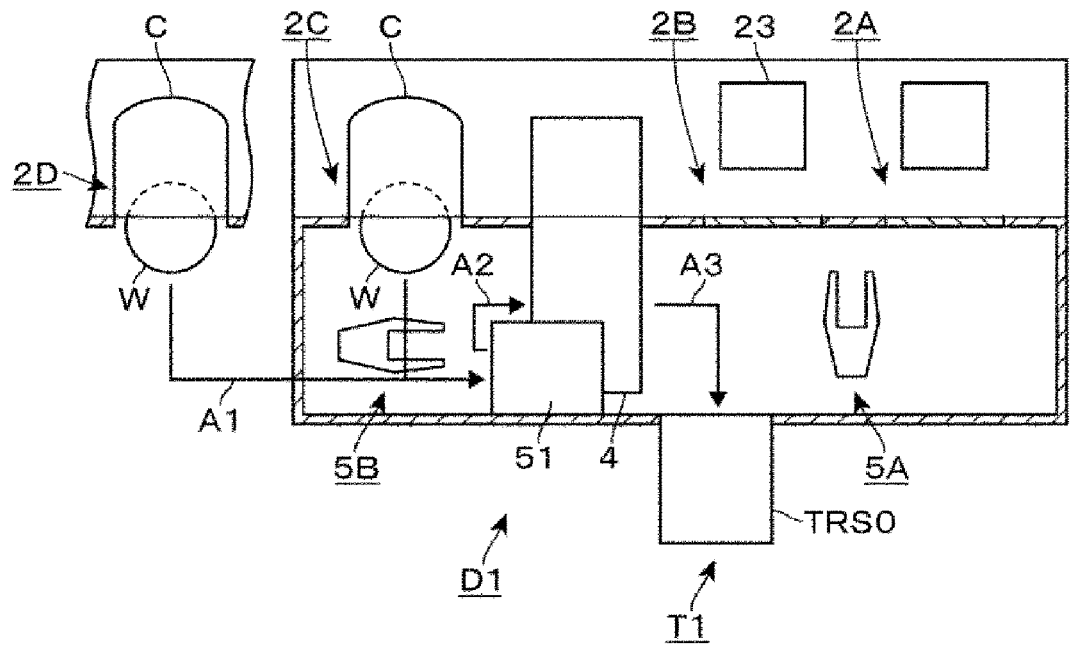
FIG. 9 is an explanatory diagram illustrating a wafer transfer path in the carrier block.
Figure 10:
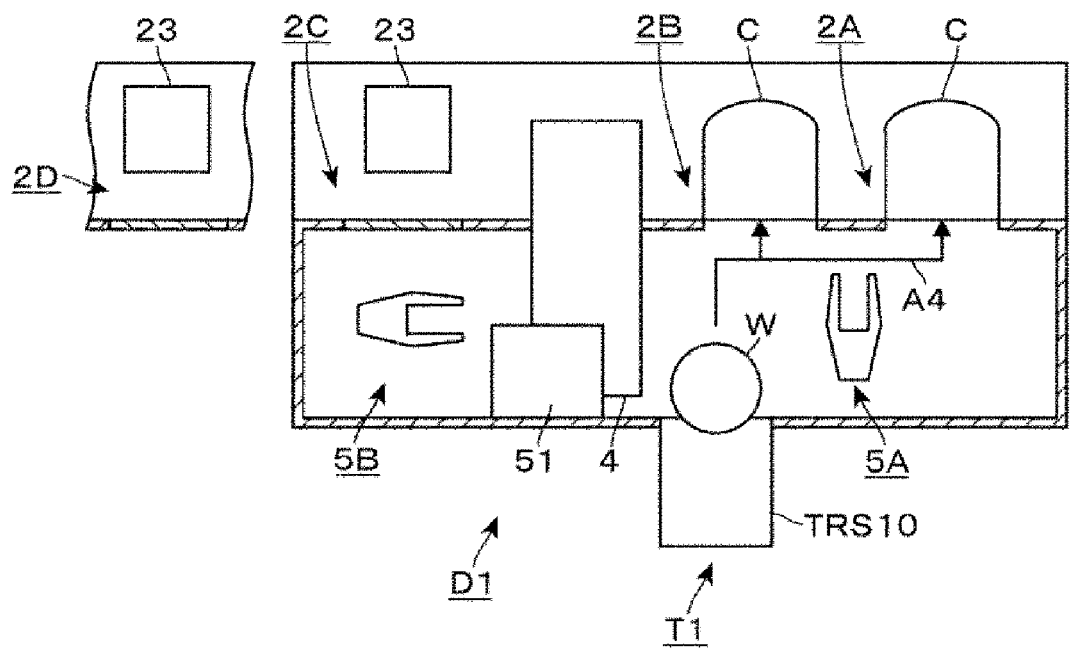
FIG. 10 is an explanatory diagram illustrating the wafer transfer path in the carrier block.

Now, referring to FIG. 9 and FIG. 10, a transfer path for the wafer W in the carrier block D1 when the formation of the resist pattern and the pre-processing inspection are performed will be discussed. In FIG. 9 and FIG. 10 and, also in FIG. 11 and FIG. 12 to be described later, for the purpose of illustration, the load ports 2C and 2D are shown to be arranged horizontally, and the inspection module 4 and the buffer module 51 are shown to be deviated from each other.

In case of performing the pre-processing inspection, the load ports 2C and 2D are used as carry-in load ports for carrying the wafer W into the apparatus, and the load ports 2A and 2B are used as carry-out load ports for carrying the wafer W out of the apparatus, for example. First, the wafer W is transferred into the buffer module 51 by the transfer mechanism 5B from the carriers C respectively placed on the load ports 2C and 2D (as indicated by an arrow A1 in FIG. 9).

Then, if the inspection module 4 is ready to accommodate the wafer W therein, the wafer W is carried into the inspection module 4 by the transfer mechanism 5B (as indicated by an arrow A2 in FIG. 9), and the image data of the surface of the wafer W are acquired, and the inspection is performed. Thereafter, the wafer W is carried out of the inspection module 4 by the transfer mechanism 5A and transferred into the transit module TRS0 of the tower T1 (as indicated by an arrow A3 in FIG. 9). The wafer W transferred into the transit module TRS0 is then sent into the processing block D2, the interface block D3 and the exposure apparatus D4 as described above. Then, after the resist pattern is formed, the wafer W is transferred into the transit module TRS10 of the tower T1, and then transferred into the carrier C on the load port 2A or 2B by the transfer mechanism 5A (as indicated by an arrow A4 in FIG. 10).

Figure 11:
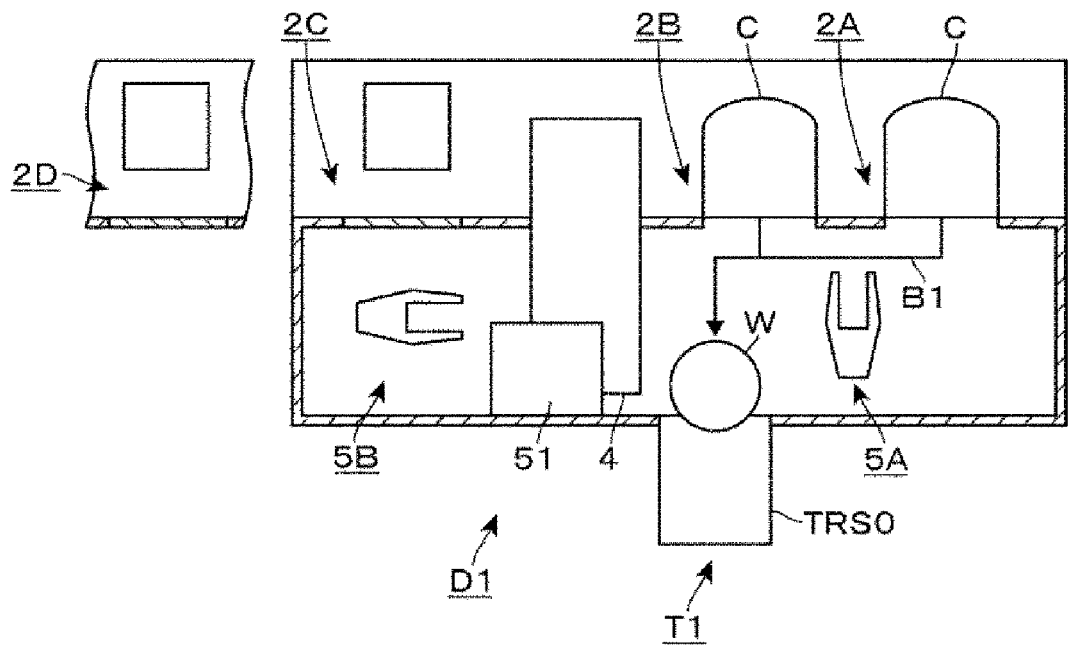
FIG. 11 is an explanatory diagram illustrating the wafer transfer path in the carrier block.
Figure 12:
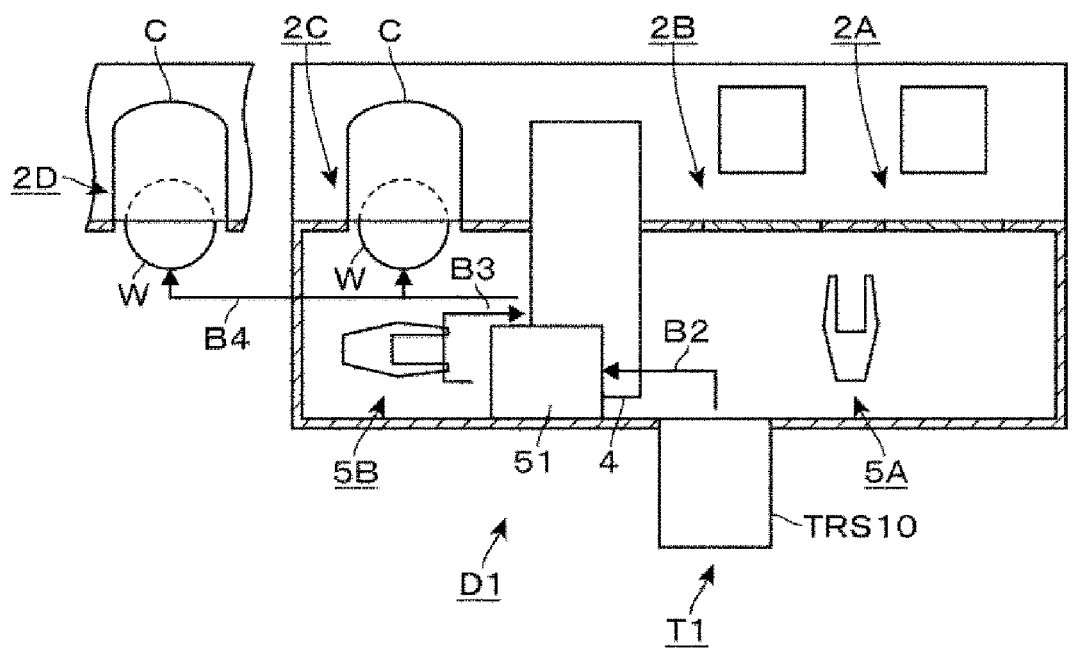
FIG. 12 is an explanatory diagram illustrating the wafer transfer path in the carrier block.

Now, referring to FIG. 11 and FIG. 12, a transfer path for the wafer W in the carrier block D1 when the formation of the resist pattern and the post-processing inspection are performed will be described. In case of performing the post-processing inspection, the load ports 2A and 2B are used as carry-in load ports, and the load ports 2C and 2D are used as carry-out load ports, for example. First, the wafer W is transferred into the transit module TRS0 of the tower T1 by the transfer mechanism 5A from the carrier C placed on the load ports 2A and 2B (as indicated by an arrow B1 in FIG. 11). As stated above, after the resist pattern is formed as the corresponding wafer W is transferred into the processing block D2, the interface block D3 and the exposure apparatus D4, the wafer W is transferred into the transit module TRS10 of the tower T1.

Subsequently, the wafer W is transferred into the buffer module 51 from the transit module TRS10 by the transfer mechanism 5A (as indicated by an arrow B2 in FIG. 12). Then, if the inspection module 4 is ready to accommodate the wafer W therein, the wafer W is carried into the inspection module 4 by the transfer mechanism 5B (as indicated by an arrow B3 in FIG. 12), and the image data of the surface of the wafer W are acquired and the inspection is performed. Thereafter, the wafer W is carried out of the inspection module 4 by the transfer mechanism 5B and transferred into the carrier C on the load port 2C or 2D (as indicate by an arrow B4 in FIG. 12)

Now, in each of the above-described transfers of the wafer W, the transfer path for the wafer W from the transit module TRS0 to the transit module TRS10 will be explained. The wafer W sent into the transit module TRS0 is then transferred into either one of the unit blocks E1 and E2 by the transfer mechanism 64. For example, in case of delivering the wafer W to the unit block E1, the wafer W is delivered to, among the transit modules TRS of the tower T1, the transit module TRS1 corresponding to the unit block E1 (that is, the transit module to which the wafer W can be transferred by the transfer mechanism F1). Further, in case of delivering the wafer W to the unit block E2, the wafer W is delivered to, among the transit modules TRS of the tower T1, the transit module TRS2 corresponding to the unit block E2.

Thereafter, the wafer W is transferred by the transfer mechanism F1 (F2) in the order of the transit module TRS1 (TRS2)→the antireflection film forming module→the heating module 63→the transit module TRS1 (TRS2), and is then sent by the transfer mechanism 64 into either the transit module TRS3 corresponding to the unit block E3 or the transit module TRS4 corresponding to the unit block E4. The wafer W sent to either one of the transit modules TRS3 and TRS4 is then transferred by the transfer mechanism F3(F4) in the order of the transit module TRS3 (TRS4)→the resist film forming module 62→the heating module 63→a transit module TRS31 (TRS41) of the tower T2. Thereafter, this wafer W is transferred into the exposure apparatus D4 by the transfer mechanisms 65 and 67, and the resist film formed on the surface of the wafer W is exposed according to a preset pattern.

The wafer W obtained after being exposed is transferred between the towers T2 and T4 by the transfer mechanisms 66 and 67, and sent into a transit module TRS51 (TRS61) of the tower T2 corresponding to the unit block E5 (E6). Then, the wafer W is transferred by the transfer mechanism F5 (F6) in the order of the heating module 63→the developing module. After the resist pattern is formed as the resist film is dissolved according to the pattern exposed in the exposure apparatus D4, the wafer W is then transferred to the transit module TRS10.

According to the above-described coating and developing apparatus 1, the inspection modules 4 are located between the load ports 2A and 2B provided at the left side of the carrier block D1 and the load ports 2C and 2D provided at the right side of the carrier block D1. The transfer mechanism 5A provided at the left side of the inspection modules 4 performs the transfer of the wafer W with respect to the carrier C placed on the load ports 2A and 2B and the processing block D2. Further, the transfer mechanism 5B provided at the right side of the inspection module 4 performs the transfer of the wafer W with respect to the carrier C placed on the load ports 2C and 2D. The wafer W is transferred between the transfer mechanisms 5A and 5B through the inspection modules 4 or the buffer module 51. According to this configuration, since the inspection modules 4 can be disposed in the vicinity of the load ports 2A to 2D, the wafer W immediately after being carried into the coating and developing apparatus 1 and the wafer W immediately before being carried out from the coating and developing apparatus 1 can be both inspected. Therefore, in case that an abnormality of the wafer W occurs before the wafer W is carried into the coating and developing apparatus 1, it can be accurately determined that the abnormality has occurred at the outside of the coating and developing apparatus 1. If the abnormality has occurred during the processings and the transfers within the coating and developing apparatus 1, on the other hand, the corresponding abnormality can be detected securely.

According to the configuration of the carrier bock D1, in addition to the advantage that the above-described inspection can be carried out, the number of the load ports accessed by each of the transfer mechanisms 5A and 5B is reduced. Further, the transfer of the wafer W with respect to the processing block D2 is performed by the transfer mechanism 5A, whereas the transfer of the wafer W into the inspection module 4 is performed by the transfer mechanism 5B which does not perform the transfer of the wafer W with respect to the processing block D2. That is, the functions of the transfer mechanisms 5A and 5B are separated, so that the number of times each of the transfer mechanisms 5A and 5B performs the transfer of the wafer W in order to transfer the wafer W between the carrier C and the processing block D2 and in order to perform the inspection during this transfer can be reduced. That is, since a load increase of each of the transfer mechanisms 5A and 5B is suppressed, the throughput of the apparatus can be improved.

Regarding the inspection module 4 provided between the load ports arranged in the left-right direction, the inspection module 4 is provided at the same height as the transfer openings 21 of the load ports 2A to 2C. That is, the inspection module 4 and the load ports 2A to 2C are arranged in a row from side to side. With this configuration, a distance between the carriers C on the load ports 2A to 2C and the inspection module 4 can be set to be relatively short, so that the wafer W can be rapidly transferred between the carrier C on the load ports 2A to 2C and the inspection module 4. Therefore, the throughput of the apparatus can be further improved. Besides, even in case that the transfer is performed between the carrier C and the inspection module 4 through the buffer module 51 as described above, if the inspection module 4 and the load ports 2A to 2C are arranged in a row, an increase of a moving distance of the transfer mechanisms 5A and 5B can be suppressed by placing the buffer module 51 near the inspection module 4. Therefore, the transfer of the wafer W can be performed rapidly.

Furthermore, by providing the load port 2D in addition to the load ports 2A to 2C as described above, deterioration of the throughput that might be caused by the lack of the load ports can be avoided. By disposing this load port 2D above the load port 2C, an increase of a footprint of the carrier block D1, which may be caused by providing the inspection module 4 at the aforementioned position and by providing the four load ports, can be suppressed. Moreover, with regard to the load ports 2A to 2C, since the transfer openings 21 thereof are respectively opened/closed by the elevating doors 24, left and right spaces required to open/close the transfer openings 21 are reduced, so that an increase of the distance between the inspection module 4 and the load ports can be suppressed. Thus, an increase of a width of the carrier block D1 in the left-right direction can be suppressed. Meanwhile, as the transfer opening 21 of the load port 2D is opened/closed by the rotating door 25, upper and lower spaces required to open/close the transfer opening 21 can be reduced, so that a distance between the load ports 2C and 2D can be shortened. That is, even if the load ports 2C and 2D are vertically arranged, the length by which the transfer mechanism 5B is moved up and down to access the load ports 2C and 2D is set to be short, so that the throughput can be increased more securely.

Furthermore, though the two inspection modules 4 are provided to suppress the reduction of the throughput, only one inspection module 4 may be provided. Furthermore, more than two inspection modules 4 may be provided. In such a case, to allow each of the transfer mechanisms 5A and 5B to transfer the wafer W while suppressing the increase of the footprint of the apparatus, it is desirable to stack the inspection modules 4 on top of each other.

Further, the inspection module 4 is not limited to being provided at the same height as the transfer openings 21 of the load ports 2A to 2C. By way of example, the buffer module 51 may be provided at the same height as the transfer openings 21 of the load ports 2A to 2C, and the inspection module 4 may be provided at a position higher than the buffer module 51. In such a case, however, the height of the load port 2D with respect to the load port 2C may be increased to avoid interference between the rotating door 25 of the load port 2D and the inspection module 4. Accordingly, the length by which the transfer mechanism 5B is moved up and down to access the load ports 2C and 2D may be increased. Thus, from the point of view of carrying out the rapid transfer of the wafer between the carrier C of the load ports 2A to 2C and the inspection module 4, it may be desirable to provide the inspection module 4 at the same height as the transfer openings 21 of the load ports 2A to 2C.

Further, when viewed from the top, since the buffer module 51 is provided to overlap with the placing unit 43 at the standby position of the inspection module 4, the base 55 at which the fork 56 is provided in the transfer mechanism 5A (5B) can transfer the wafer W standing by in the buffer module 51 into the inspection module 4 only through the elevating motions without being moved in the left-right direction. Accordingly, a time taken to transfer the wafer W between the buffer module 51 and the inspection module 4 can be shortened, so that the throughput can be increased more securely. Furthermore, the buffer module 51 may not be provided in the carrier block D1, and the transfer of the wafer W between the transfer mechanisms 5A and 5B may be performed only through the inspection module 4. In this configuration, when carrying the wafer W into the inspection module 4, the transfer mechanism 5A or 5B may stand by while holding the wafer W thereon until the inspection module 4 is emptied. Since, however, the transfer mechanisms 5A and 5B cannot perform a transfer of another wafer W while they are holding the wafer W, it may be effective to provide the buffer module 51 to suppress the deterioration of the throughput.

Furthermore, in the above-described carrier block D1, the placing unit 43 of the inspection module 4 and the buffer module 51 are configured as the transit units in which the wafer W is placed to be transferred between the transfer mechanisms 5A and 5B. However, a transit unit may be provided separately from the inspection module 4 and the buffer module 51. As the inspection module 4 also serves as the transit unit, however, the transfer mechanism 5A can directly take the wafer W after being subjected to the inspection from the inspection module 4 as shown in FIG. 9 and, then, transfer the wafer W to the tower T1. Further, as the buffer module 51 also serves as the transit unit, the wafer W of the tower T1 can be directly transferred into the buffer module 51 to stand by therein as depicted in FIG. 12. That is, as the inspection module 4 and the buffer module 51 are used as the transit units, the load of the transfer mechanisms 5A and 5B can be suppressed, and the throughput can be improved.

Further, the present exemplary embodiment is not limited to the configuration in which either one of the pre-processing inspection and the post-processing inspection is performed until the wafer W taken from the carrier C is returned back into the carrier C. An example of a transfer during which the pre-processing inspection and the post-processing inspection are performed will be explained. First, as shown by arrows A1 to A3 of FIG. 9, by transferring the wafer W carried out of the load ports 2C and 2D in the order of the buffer module 51→the inspection module 4→the transit module TRS0, the pre-processing inspection is performed on the corresponding wafer W, and the wafer W is transferred into the processing block D2. Further, as shown by arrows B2 to B3 of FIG. 12, by transferring the wafer W sent into the transit module TRS10 after the resist pattern is formed thereon in the order of the buffer module 51→the inspection module 4, the post-processing inspection is performed on the wafer W, and the wafer W is transferred into the carrier C of the load ports 2A and 2B. By performing both the pre-processing inspection and the post-processing inspection as described above, it can be more securely specified, when the abnormality in the wafer W is detected, whether this abnormality is caused by the coating and developing apparatus 1 or caused by the outside of the coating and developing apparatus 1.

Another example of the transfer during which the pre-processing inspection is performed will be explained. As indicated by arrows A1 to A3 of FIG. 9, the wafer W taken out of the carrier C of the load ports 2C and 2D is transferred in the order of the buffer module 51→the inspection module 4→the transit module TRS0. The wafer W sent into the transit module TRS10 after the resist pattern is formed thereon is transferred into the buffer module 51 by the transfer mechanism 5A, and, subsequently, the wafer W is transferred into the carrier C of the load ports 2C and 2D by the transfer mechanism 5B. That is, if this series of transfer operations is referred to as "first carry-in/out transfer," the load ports 2C and 2D serve as the carry-in load port and the carry-out load port in the first carry-in/out transfer.

Another example of the transfer during which the post-processing inspection is performed will be described. As described in FIG. 11, the wafer W, which is transferred into the transit module TRS0 from the carrier C of the load ports 2A and 2B and then transferred into the transit module TRS10 after the resist film is formed thereon, is transferred in the order of the buffer module 51→the inspection module 4, as indicated by arrows B2 and B3 of FIG. 12. Then, this wafer W is carried into the carrier C of the load ports 2A and 2B from the inspection module 4 by the transfer mechanism 5A. That is, if this series of transfer operations is referred to as "second carry-in/out transfer," the load ports 2A and 2B serve as the carry-in load port and the carry-out load port in the second carry-in/out transfer.

By way of example, the control over the transfer of the wafer W may be performed such that the transfer of the wafer W is usually carried out as described above with reference to FIG. 9 to FIG. 12; such that the first carry-in/out transfer is performed when both of the load ports 2A and 2B are not available; and such that the second carry-in/out transfer is performed when both of the load ports 2C and 2D are not available. Further, by way of example, the first carry-in/out transfer and the second carry-in/out transfer may be performed at the same time while setting one of the two inspection modules 4 as one dedicated to the first carry-in/out transfer and the other as one dedicated to the second carry-in/out transfer. That is, the exemplary embodiment is not merely limited to the configuration in which one of the transfer mechanisms 5A and 5B is configured to only receive the wafer W from the carrier C and the other of the transfer mechanisms 5A and 5B is configured to only transfer the wafer W into the carrier C, as in the example shown in FIG. 9 to FIG. 12.

First Modification Example of First Exemplary Embodiment

Figure 13:
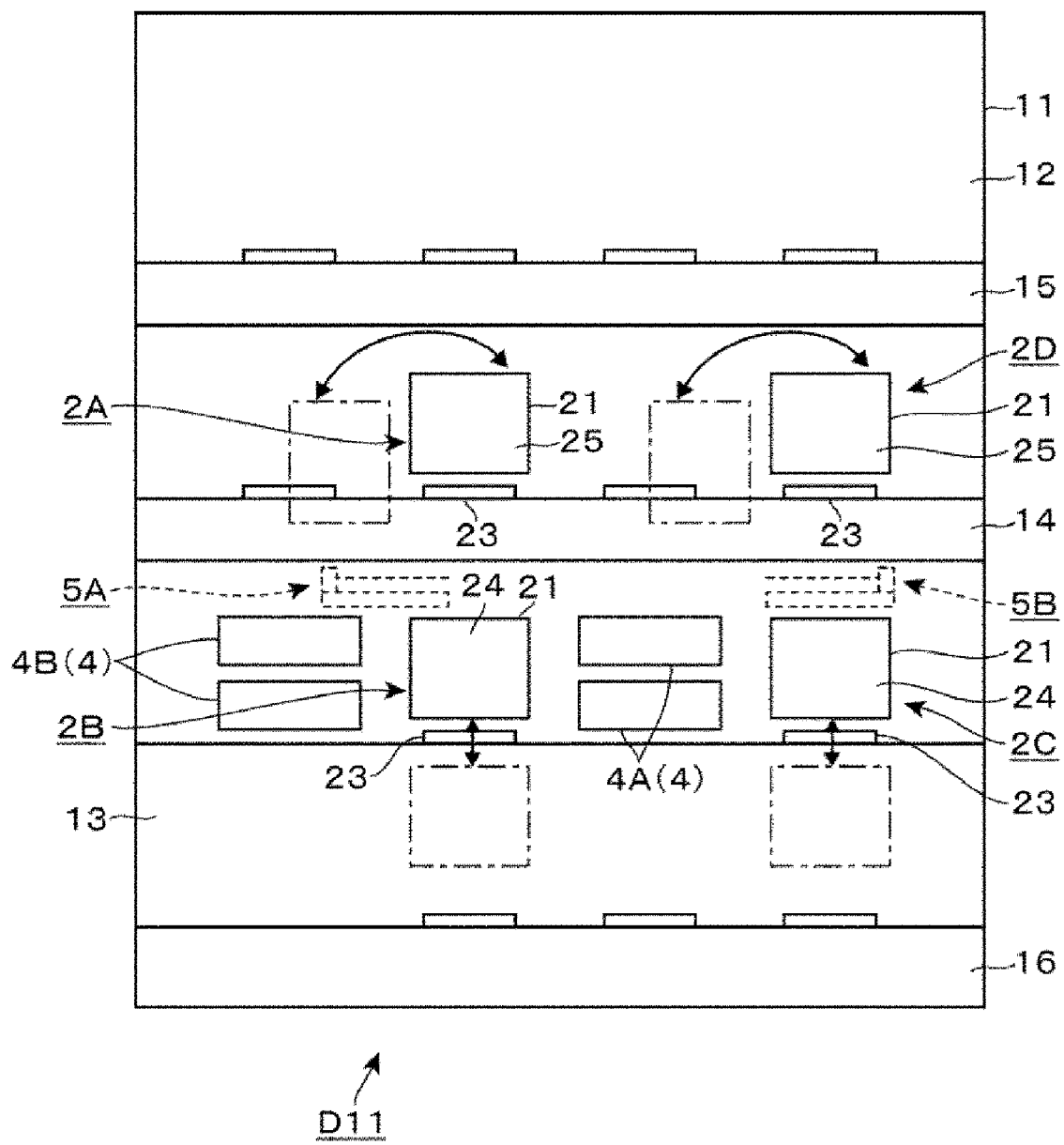
FIG. 13 is a front view illustrating a configuration of another carrier block.

Now, a carrier block D11 according to a first modification example of the first exemplary embodiment will be explained with reference to FIG. 13 while focusing on a difference from the carrier block D1. In this carrier block D11, the load port 2A is provided at the same height as the load port 2D. Further, a position of the load port 2A in the left-right direction is the same as that of the load port 2B. Not to interfere with the load port 2B, the load port 2A is equipped with the rotating door 25 configured to open/close the transfer opening 21 of the load port 2A, the same as the load port 2D. Further, in this carrier block D11, two inspection modules 4 are vertically arranged at the left of the load port 2B, the same as at the right thereof. For the convenience of explanation, the two inspection modules at the right of the load port 2B will be assigned reference numerals 4A, and the two inspection modules at the left of the load port 2B will be assigned reference numerals 4B. Since the inspection modules 4B and the load port 2A are located at the left of the inspection modules 4A, the transfer mechanism 5A transfers the wafer W with respect to the inspection modules 4B and the load port 2A.

An example of a transfer in the carrier block D11 will be described. By way of example, as stated in FIG. 9, the wafer W transferred into the buffer module 51 after being taken out of the carrier C on the load ports 2C and 2D is transferred into the inspection module 4A by the transfer mechanism 5B or into the inspection module 4B by the transfer mechanism 5A to be subjected to the pre-processing inspection. The wafer W after being inspected is transferred into the transfer module TRS0 of the tower T1 by the transfer mechanism 5A. Further, as another transfer example, the wafer W transferred into the buffer module 51 from the transit module TRS10 may be transferred into the inspection module 4A (4B) to perform the post-processing inspection on the wafer W, and, then, the wafer W may be returned back into the carrier C on a preset load port. According to this carrier block D11, since the number of the inspection modules 4 is larger than that in the first exemplary embodiment, a standby time of the wafer W in the buffer module 51 can be reduced. Since, however, the load on the transfer mechanisms 5A and 5B is increased as the transfer mechanisms 5A and 5B access the larger number of inspection modules 4 as compared to in the carrier module D1, it may be more desirable to adopt the configuration of the carrier block D1 to achieve the higher throughput.

Second Modification Example of the First Exemplary Embodiment

Figure 14:
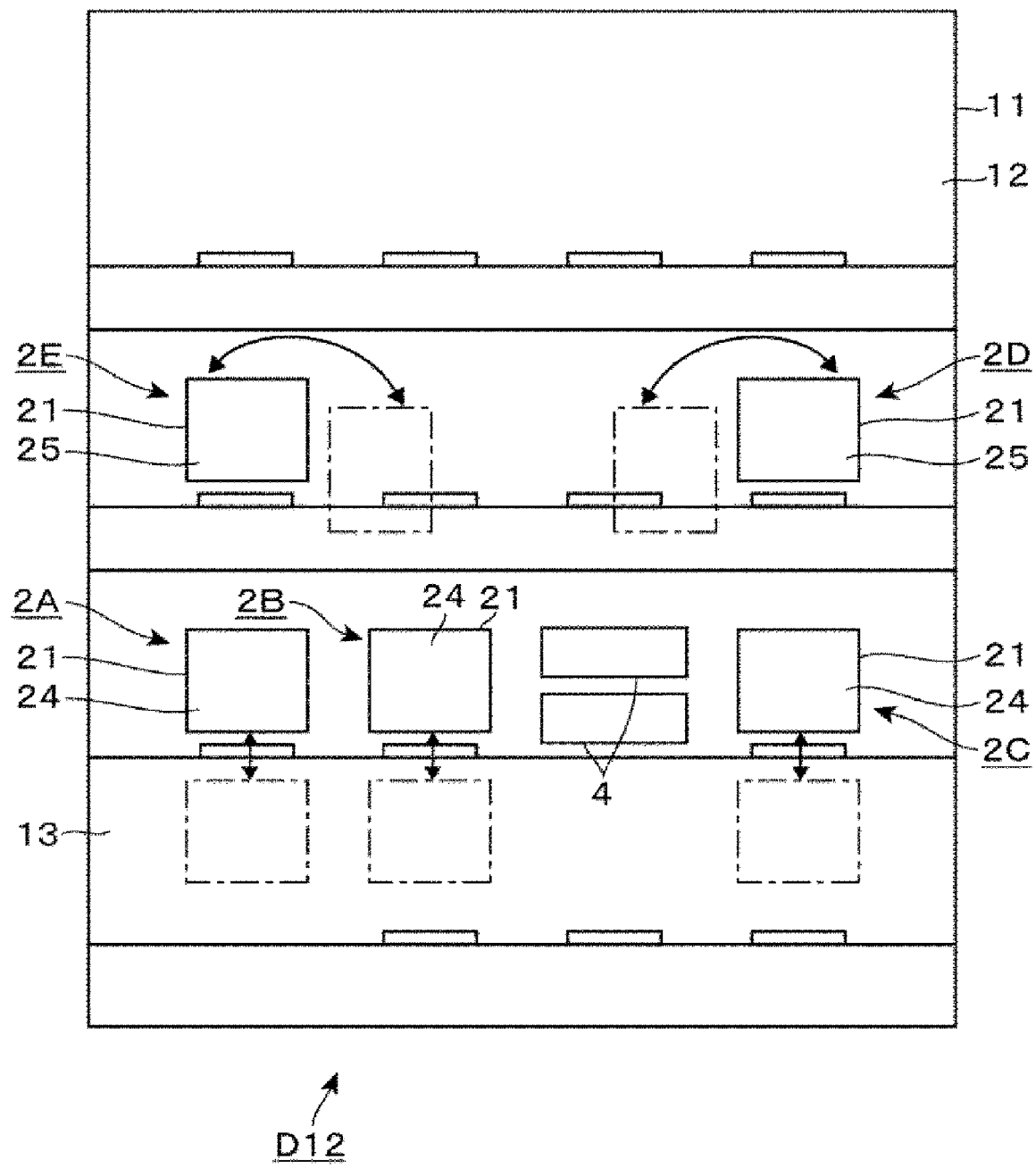
FIG. 14 is a front view illustrating a configuration of yet another carrier block.

Now, a carrier block D12 according to a second modification example will be explained with reference to FIG. 14 while focusing on a difference from the carrier block D1. In this carrier block D12, a load port 2E is provided in addition to the load ports 2A to 2D. This load port 2E is provided at the same height as the load port 2D. Further, a position of the load port 2E in the left-right direction is the same as that of the load port 2A. Not to interfere with the load port 2A, the load port 2E is equipped with the rotating door 25, the same as the load port 2D. Here, however, not to interfere with the sidewall of the housing 11 of the carrier block D1, the rotating door 25 of this load port 2E is rotated clockwise from the closing position, to the contrary to the rotating door 25 of the load port 2D. Since the load port 2E is located at the left of the inspection module 4, the transfer mechanism 5A transfers the wafer W with respect to the carrier C placed at the corresponding load port 2E.

In this carrier block D12, the transfer of the wafer W is performed as described in FIG. 9 to FIG. 12, for example. When the load ports 2A and 2B are used as the carry-in load ports, the load port 2E, for example, is also used as the carry-in load port, whereas when the load ports 2A and 2B are used as the carry-out load ports, the load port 2E, for example, is also used as the carry-out load port.

According to the present disclosure, as described in the first exemplary embodiment and the various modification examples thereof, the two transfer mechanisms 5A and 5B are provided, and the inspection modules 4 and the load ports may be provided in a region in which the transfer of the wafer W can be performed by either one of these transfer mechanisms. Accordingly, the degree of freedom in arranging these inspection modules 4 and load ports 2 is high, and, thus, it is easy to design the apparatus depending on a required level of throughput, a time required for the inspection in the inspection modules 4, and so forth.

Second Exemplary Embodiment

Figure 15:
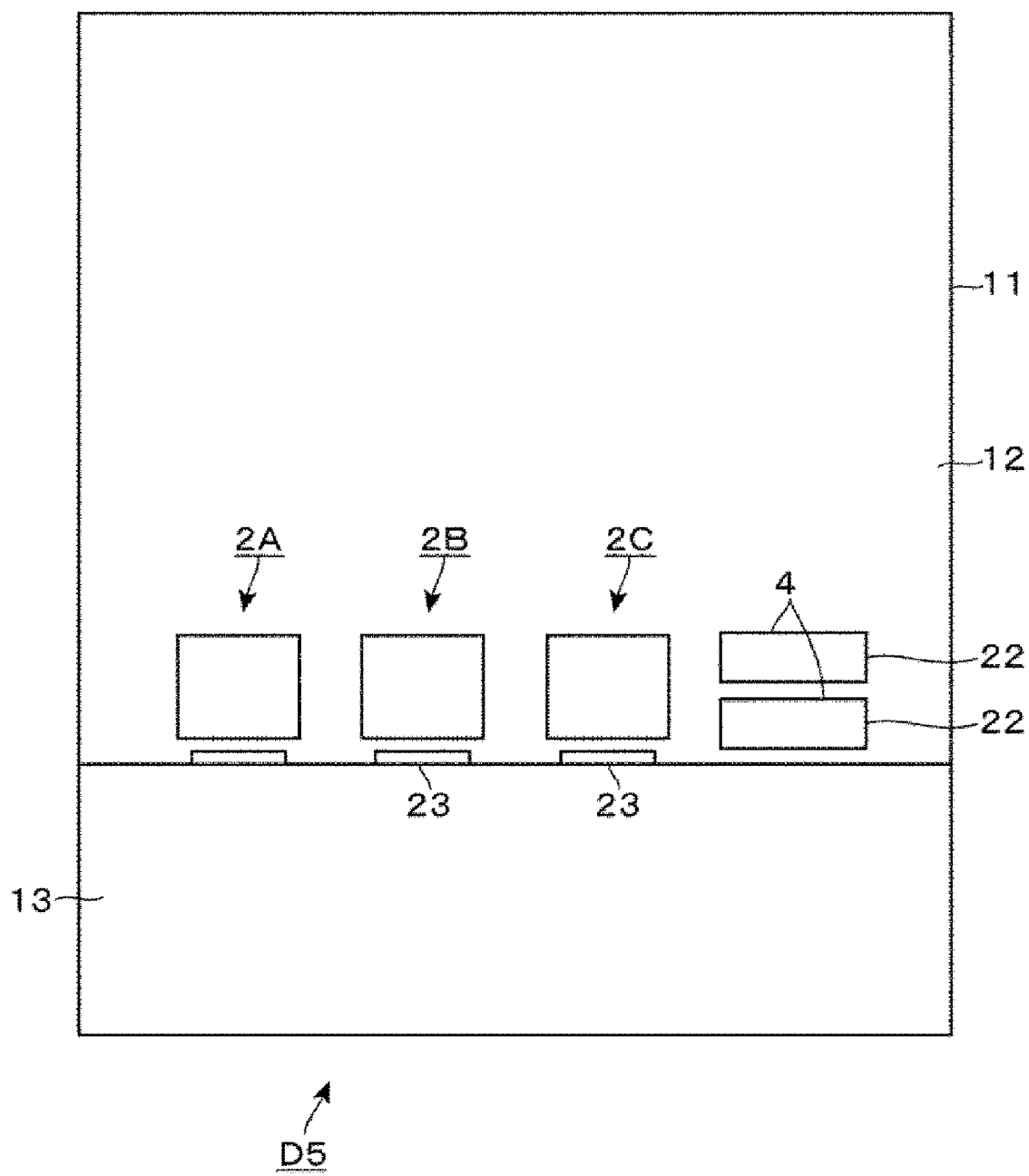
FIG. 15 is a front view illustrating a configuration of still yet another carrier block.
Figure 16:
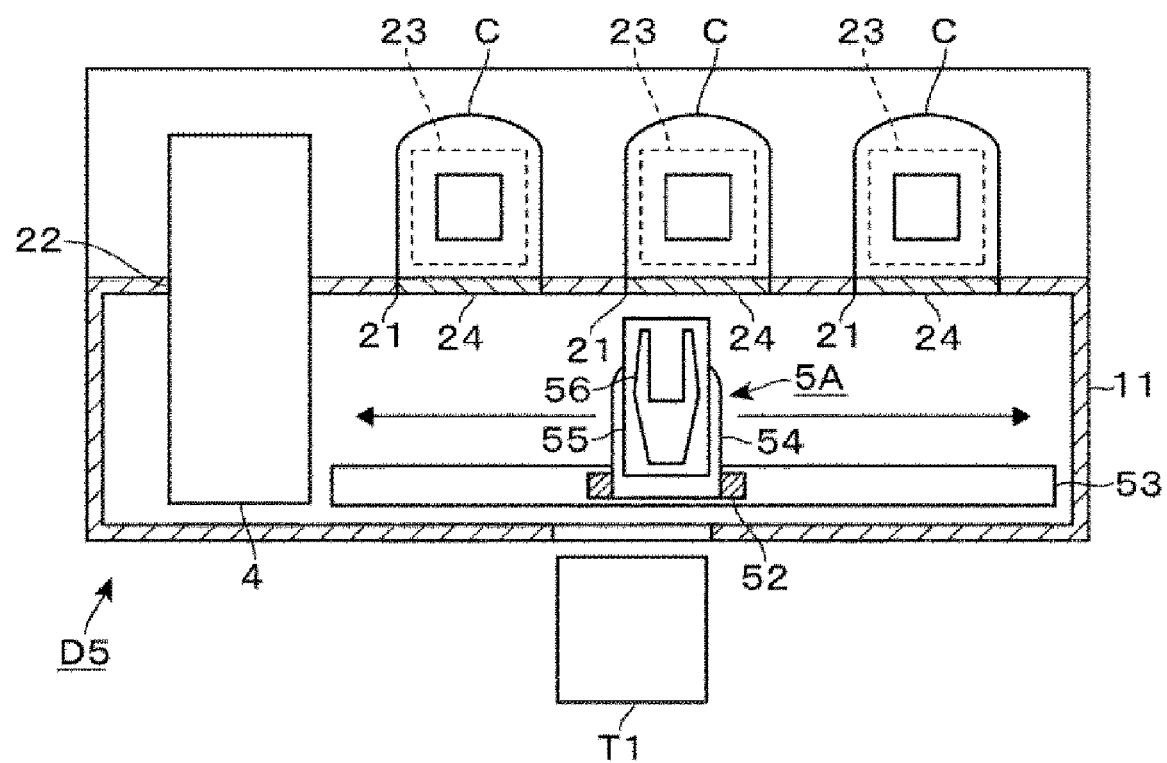
FIG. 16 is a transversal plan view illustrating the configuration of the still yet another carrier block.

Now, a coating and developing apparatus according to a second exemplary embodiment will be explained while focusing on a difference from the first exemplary embodiment. FIG. 15 and FIG. 16 are a front view and a transversal plan view of a carrier block D5 provided in the coating and developing apparatus according to the second exemplary embodiment. In the carrier block D5, though load ports 2A to 2C and two inspection modules 4 are provided, the load ports 2A to 2C are located at the left of each inspection module 4. Further, in the carrier block D5, the supporting tables 15 to 17 are not provided, and an external transfer mechanism configured to transfer the carrier C with respect to the carrier block D5 transfers the carrier C onto the moving stage 23 of the load ports 2A to 2C. Further, the transfer is not performed between the standby stage 29, the carry-in stage 31 and the carry-out stage 32 of the carrier C. Furthermore, between the transfer mechanisms 5A and 5B, only the transfer mechanism 5A is provided within the housing 11, and the frame 52 of this transfer mechanism 5A is moved in the left-right direction to deliver the wafer W to the carrier C placed on the load ports 2A to 2C.

The transfer mechanism 5A takes out the wafer W from the carrier C on the load ports 2A to 2C and transfers the taken wafer W to the transit module TRS0 of the tower T1, and transfers the wafer W, which is sent into the transit module TRS10 of the tower T1 after the resist pattern is formed thereon, into the carrier C of the load ports 2A to 2C. When the pre-processing inspection is performed, the wafer W is transferred to and inspected in the inspection module 4 before being transferred to the transit module TRS0. When the post-processing inspection is performed, the wafer W is transferred to and inspected in the inspection module 4 before being returned back into the carrier C.

Figure 17:
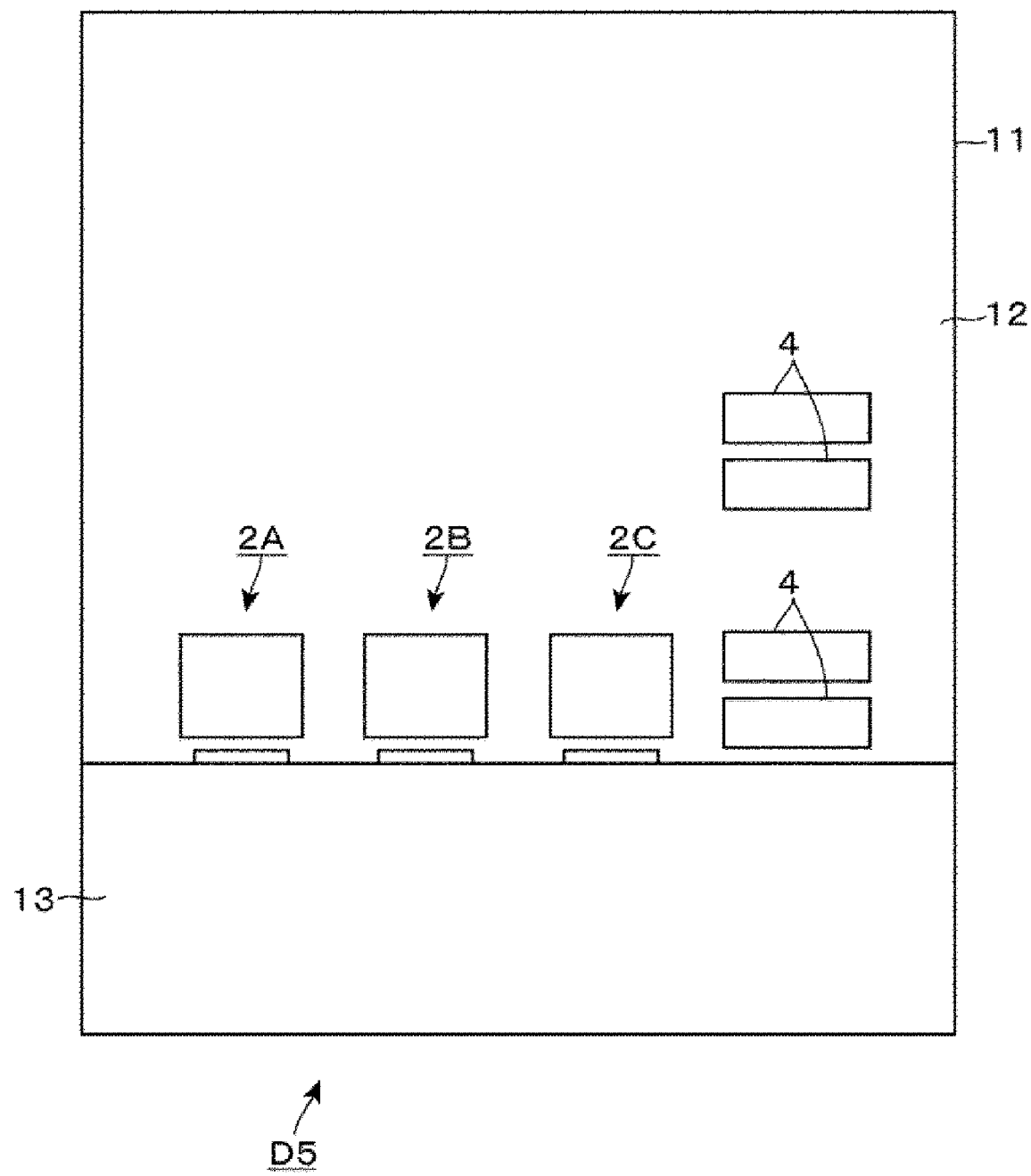
FIG. 17 is a front view illustrating a configuration of still yet another carrier block.

FIG. 17 shows a modification example of the carrier block D5 and illustrates an example in which two inspection modules 4 are vertically arranged with a gap therebetween in the region in which the transfer opening 21 of the load port 2D is formed in the first exemplary embodiment. In the carrier block D5 shown in FIG. 17, the four inspection modules 4 are arranged in the vertical direction. In the second exemplary embodiment as described above, since each inspection module 4 is configured to be provided detachably from the housing 11 of the carrier block D5, the same as in the first exemplary embodiment, the maintenance can be performed easily.

Furthermore, since the inspection module 4 is fitted into the opening 22 of the housing 11 from the outside of the housing 11, the inspection module 4 may be provided such that a part thereof is protruded from the housing 11 of the carrier block. That is, since the occupying space of the inspection module 4 within the apparatus is reduced, it may not happen that the inspection module 4 cannot be provided as other modules are added or provided within the apparatus. Further, since the inspection module 4 has the small occupying space and is provided detachably from the housing 11, it is easy to add the inspection module 4 without hampering the operation of the substrate transfer mechanism or the arrangement of other modules. Furthermore, as clearly seen from the first exemplary embodiment and the second exemplary embodiment, in configuring the inspection module 4 to be detachable from the housing 11, the inspection module 4 may be placed at an end of the row formed by the load ports and the inspection module 4 in the left-right direction, or may be placed at a center of the row.

The processing module into which the wafer W is transferred from the carrier block D1 and which are configured to perform processings on the wafer W is not limited to the aforementioned examples. By way of example, the processing module may include a module configured to coat a chemical liquid for forming an insulating film onto the wafer W, a cleaning module configured to supply a cleaning liquid onto the wafer W, or a module configured to supply an adhesive for joining the wafers W, and so forth. Furthermore, there may be provided a processing module configured to create a vacuum atmosphere through a load lock module which is configured to be switchable between an atmospheric atmosphere and a vacuum atmosphere, for example. In such a case, processings such as CVD, ALD or etching can be performed by supplying a processing gas to the wafer W. Moreover, the present disclosure is not limited to the above-described examples, and the examples may be appropriately modified or combined.

From the foregoing, it will be appreciated that the exemplary embodiment of the present disclosure has been described herein for purposes of illustration, and that various modifications may be made without departing from the scope and spirit of the present disclosure. Accordingly, the embodiment disclosed herein is not intended to be limiting. The scope of the inventive concept is defined by the following claims and their equivalents rather than by the detailed description of the exemplary embodiment. It shall be understood that all modifications and embodiments conceived from the meaning and scope of the claims and their equivalents are included in the scope of the inventive concept.

I claim:

1. A substrate processing apparatus, comprising:
   a first load port and a second load port respectively configured to place thereon a transfer container accommodating a substrate therein;
   a processing unit configured to perform a processing on the substrate;
   an inspection module provided between the first load port and the second load port in a left-right direction, and configured to inspect the substrate before or after the processing by the processing unit is performed;
   a first substrate transfer mechanism provided at a first side of the inspection module in the left-right direction, and configured to transfer the substrate into the processing unit and the transfer container placed on the first load port;

a second substrate transfer mechanism provided at a second side of the inspection module opposite to the first side in the left-right direction, and configured to transfer the substrate into the inspection module and the transfer container placed on the second load port; and a transit unit configured to transit the substrate between the first substrate transfer mechanism and the second substrate transfer mechanism.

2. The substrate processing apparatus of claim 1, wherein the first load port, the second load port and the inspection module are arranged in a row in the left-right direction.

3. The substrate processing apparatus of claim 1, wherein at least one of the first load port and the second load port is composed of multiple load ports, and the multiple load ports include an upper load port and a lower load port which are arranged vertically.

4. The substrate processing apparatus of claim 3, wherein the upper load port is equipped with a rotating door configured to open/close a transfer opening for the substrate by being rotated around a rotation axis which corresponds to a forward-backward direction.

5. The substrate processing apparatus of claim 1, wherein the transit unit is also used as a standby in which the substrate stands by before being carried into the inspection module.

6. The substrate processing apparatus of claim 1, further comprising:
a control unit configured to output a control signal such that one of the first substrate transfer mechanism and the second substrate transfer mechanism performs, between a receipt of the substrate from the transfer container and a transfer of the substrate into the transfer container, only the receipt of the substrate from the transfer container, and such that the other of the first substrate transfer mechanism and the second substrate transfer mechanism performs, between the receipt of the substrate from the transfer container and the transfer of the substrate into the transfer container, only the transfer of the substrate into the transfer container.

7. The substrate processing apparatus of claim 1, wherein a first housing is provided to accommodate therein the first substrate transfer mechanism, the second substrate transfer mechanism and the transit unit, and the first housing is provided with a sidewall at which a transfer opening for the substrate constituting the first load port and a transfer opening for the substrate constituting the second load port are opened, and
the inspection module is equipped with a second housing accommodating therein the substrate to inspect the substrate, and the second housing is detachably fitted from an outside of the first housing into an opening provided at the sidewall of the first housing.

8. The substrate processing apparatus of claim 1, wherein the inspection module comprises a placing unit configured to place thereon the substrate transferred by the second substrate transfer mechanism, and
the transit unit and the placing unit are vertically arranged to be overlapped with each other.

9. The substrate processing apparatus of claim 1, wherein the inspection module is plural in number, and the inspection modules are respectively arranged at a left side and a right side of the first load port or the second load port.

10. The substrate processing apparatus of claim 1, further comprising:
a placing unit for the transfer container provided under the first load port and the second load port, and configured to allow the transfer container to stand by thereon; and
a transfer mechanism for the transfer container configured to transfer the transfer container between the first load port or the second load port and the placing unit for the transfer container.

11. A substrate processing apparatus, comprising:
a first load port and a second load respectively configured to place thereon a transfer container accommodating a substrate therein;
a processing unit configured to perform a processing on the substrate;
an inspection module provided between the first load port and the second load port in a left-right direction, and configured to inspect the substrate before or after the processing by the processing unit is performed;
a first substrate transfer mechanism provided at a first side of the inspection module in the left-right direction, and configured to transfer the substrate into the processing unit and the transfer container placed on the first load port; and
a second substrate transfer mechanism provided at a second side of the inspection module opposite to the first side in the left-right direction, and configured to transfer the substrate into the inspection module and the transfer container placed on the second load port,
wherein the inspection module is also configured to transit the substrate between the first substrate transfer mechanism and the second substrate transfer mechanism.

12. A substrate processing method, comprising:
placing a transfer container accommodating a substrate therein on each of a first load port and a second load port;
performing a processing on the substrate by a processing unit;
inspecting, before or after the processing by the processing unit is performed, the substrate by an inspection module provided between the first load port and the second load port in a left-right direction;
transferring the substrate into the processing unit and the transfer container placed on the first load port by a first substrate transfer mechanism provided at a first side of the inspection module in the left-right direction;
transferring the substrate into the inspection module and the transfer container placed on the second load port by a second substrate transfer mechanism provided at a second side of the inspection module opposite to the first side in the left-right direction; and
transferring the substrate between the first substrate transfer mechanism and the second substrate transfer mechanism via a transit unit.

13. A non-transitory computer-readable recording medium having stored thereon computer-executable instructions that, in response to execution, cause a substrate processing apparatus to perform a substrate processing method as claimed in claim 12.

* * * * *